(12) United States Patent
Inoue et al.

(10) Patent No.: US 7,547,233 B2
(45) Date of Patent: Jun. 16, 2009

(54) CAPACITOR UNIT

(75) Inventors: Tatehiko Inoue, Hirakata (JP); Junji Takemoto, Nishinomiya (JP); Shusaku Kawasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 812 days.

(21) Appl. No.: 10/543,061

(22) PCT Filed: Sep. 16, 2004

(86) PCT No.: PCT/JP2004/013514

§ 371 (c)(1),
(2), (4) Date: Jul. 21, 2005

(87) PCT Pub. No.: WO2005/029519

PCT Pub. Date: Mar. 31, 2005

(65) Prior Publication Data

US 2006/0050468 A1    Mar. 9, 2006

(30) Foreign Application Priority Data

Sep. 18, 2003  (JP)  ............... 2003-325812
Sep. 18, 2003  (JP)  ............... 2003-325813
Sep. 18, 2003  (JP)  ............... 2003-325815

(51) Int. Cl.
*H01G 4/38* (2006.01)
(52) U.S. Cl. ..................... 439/627; 361/328
(58) Field of Classification Search ........... 439/627; 361/328–330, 522, 434; 429/99; 320/166
See application file for complete search history.

(56) References Cited

U.S. PATENT DOCUMENTS

| 5,016,139 | A * | 5/1991 | Stopa et al. ............... 361/720 |
| 5,337,205 | A * | 8/1994 | Haun et al. ............... 361/56 |
| 5,373,418 | A * | 12/1994 | Hayasi ............... 361/707 |
| 5,940,263 | A * | 8/1999 | Jakoubovitch ............... 361/328 |
| 6,265,840 | B1 * | 7/2001 | Wiezorek et al. ............... 318/434 |
| 6,445,584 | B1 * | 9/2002 | Riehl et al. ............... 361/707 |
| 6,717,797 | B1 * | 4/2004 | Martin et al. ............... 361/601 |
| 7,050,287 | B2 * | 5/2006 | Bauer ............... 361/301.3 |

FOREIGN PATENT DOCUMENTS

| JP | 59-171324 | 11/1984 |
| JP | 10-189402 | 7/1998 |
| JP | 2002-142373 | 5/2002 |
| JP | 2002-345262 | 11/2002 |
| JP | 2002-345262 A | 11/2002 |

* cited by examiner

*Primary Examiner*—Neil Abrams
(74) *Attorney, Agent, or Firm*—RatnerPrestia

(57) ABSTRACT

A capacitor unit is provided, which has a long lifetime and is free from maintenance when it is used as an emergency power supply of electronic control braking system, etc. and in which weight load is not applied to a circuit board, high reliability in use under harsh vibration conditions is achieved, and short-circuit defect does not occur even when an explosion-proof valve operates. The capacitor unit of the present invention includes a plurality of capacitors, a circuit board on which a circuit pattern for connecting the capacitors is formed, and a holder sandwiching and retaining the body parts of the capacitors.

39 Claims, 16 Drawing Sheets

CAPACITOR UNIT

This application is a U.S. National Phase Application of PCT International Application PCT/JP2004/013514.

TECHNICAL FIELD

The present invention relates to a capacitor unit including a plurality of capacitors to be mounted.

BACKGROUND ART

FIG. 23 is a perspective view showing a configuration of a conventional capacitor unit of this kind; and FIG. 24 is a perspective view showing a circuit board used in the capacitor unit. In FIGS. 23 and 24, circuit board 501 is provided with mounting holes 501a into which lead wires 502b and 502c of capacitor 502 pass through. On the edge of the capacitor unit, attaching holes 501b for attaching the capacitor unit are provided. Capacitor 502 has a configuration in which a capacitor device (not shown) impregnated with driving electrolyte is housed in metal case 502a having a cylindrical shape with a bottom, and extracting lead wires 502b and 502c for external extraction is extracted as a pair of electrodes from this capacitor device.

The thus configured conventional capacitor unit is electrically connected to a circuit (not shown) provided on circuit board 501 by fitting pair of lead wires 502b and 502c of capacitor 502 into mounting holes 501a provided on circuit board 501 and then soldering the rear surface side thereof. In this way, a plurality of capacitors 502 are mounted on one circuit board 501.

Then, for use, attachment to a case or equipment to be used is carried out by screw-fixing via attaching holes 501b provided on circuit board 501.

Note here that prior art document information as to such a conventional technology is disclosed in, for example, Japanese Patent Unexamined Publication No. H06-275471.

Recently, from the viewpoint of conservation of global environment or improvement in fuel consumption, hybrid cars or electric vehicles have been rapidly developed. Furthermore, various functions for controlling vehicles have been rapidly electronized. Braking of vehicles is also being shifted from a conventional mechanical hydraulic control to electric hydraulic control, and various electric braking systems are proposed.

When an important function such as brake is out of order because voltage reduces in a battery used as a power supply or certain contingencies occur and power is not supplied, hydraulic control cannot be carried out. Therefore, a redundant system using an emergency power supply is often configured.

Conventionally, a method using another battery as an emergency power supply has been proposed. However, battery has a characteristic of deteriorating over time and its expected lifetime is at most five years when it is used for a vehicle.

Furthermore, it is difficult to detect deterioration in the process and to exhibit a function as an emergency power supply when certain contingencies occur.

Recently, as an emergency power supply substituting for a battery, much attention has been focused on a capacitor such as an electric double layer capacitor. When a capacitor is used in a way in which, for example, charging is carried out when a system is operating and discharging is carried out when a system is not operating, the lifetime of the capacitor can be extended to several times as the lifetime of a battery. Therefore, it is said that a capacitor can withstand the use for 15 years, that is, a target lifetime of a vehicle.

Note here that prior art document information as to such a conventional technology is disclosed in, for example, Japanese Patent Unexamined Publication No. 10-189402.

DISCLOSURE OF THE INVENTION

A capacitor unit comprises a plurality of capacitors; a circuit board on which a circuit pattern for connecting the plurality of capacitors in series or in parallel is formed; and a holder sandwiching and retaining the body parts of the plurality of capacitors.

Figure 1:
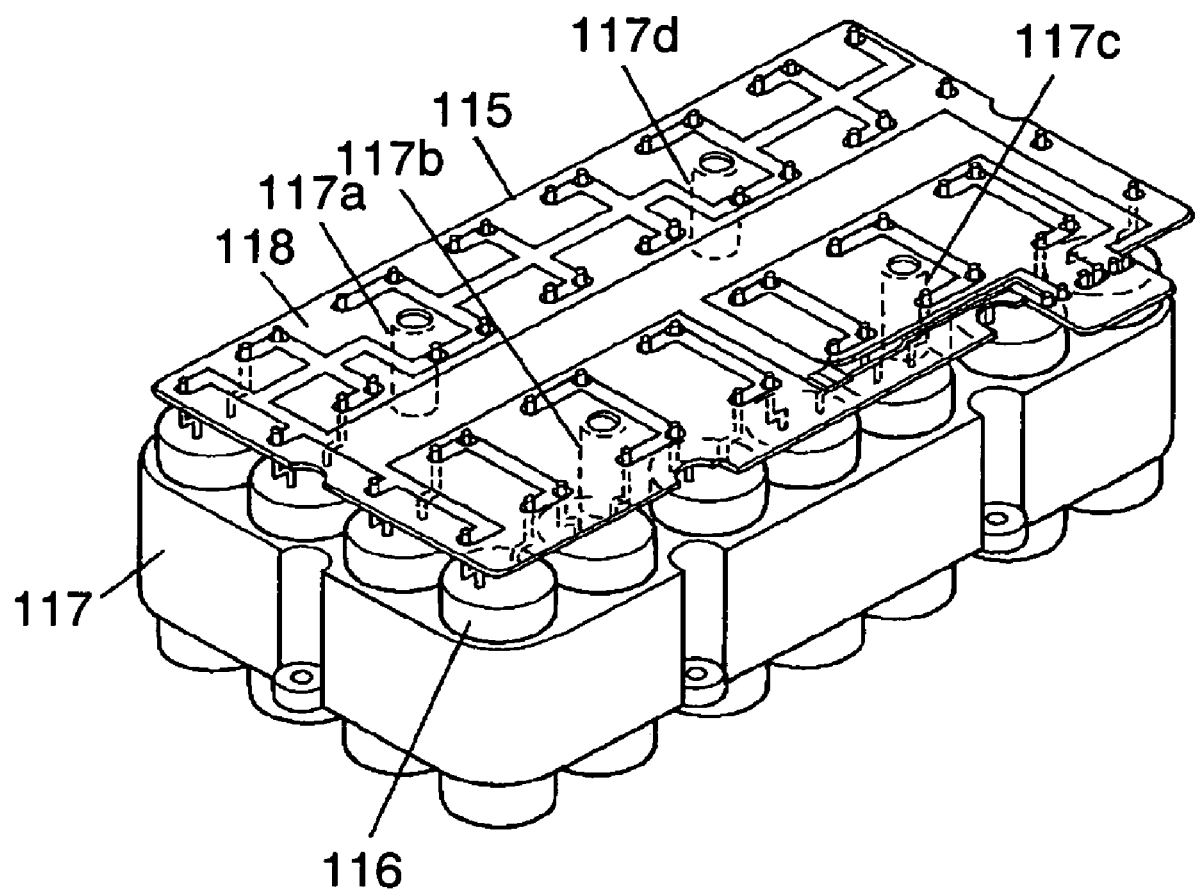
FIG. 1 is an exterior perspective view showing a capacitor unit in an exemplary embodiment of the present invention.

| DESCRIPTION OF REFERENCE NUMERALS USED IN THE DRAWINGS | |
| --- | --- |
| 115 | capacitor unit |
| 116 | capacitor |
| 116a, 116b | lead wire |
| 116c | upper surface |
| 117 | holder |
| 117a, 117b, 117c, 117d | height regulation boss |
| 117e, 117f, 117g, 117h | positioning protrusion |
| 117i, 117j, 117k, 117l | screw hole |
| 118 | circuit board |
| 118a, 118b, 118c, 118d | hole |
| 118e | soldering portion |
| 120 | cylindrical housing portion |
| 121 | rib |
| 122 | pawl |
| 122a | arc-shaped holding portion |
| 123 | slit |
| 215 | capacitor block |
| 216 | capacitor |
| 216a, 216b | lead wire |
| 216c | upper surface |
| 216e | exterior case |
| 216f | bottom portion |
| 216g | slit |
| 217 | holder |
| 217a, 217b, 217c, 217d | height regulation boss |
| 218 | circuit board |
| 218e | soldering portion |
| 220 | case |
| 223 | attaching portion |
| 224 | fixing hole |
| 225 | bottom portion |
| 226 | barrier |
| 227 | barrier |
| 301 | battery |
| 302 | capacitor unit |
| 303 | electronic control portion |
| 304 | brake pedal |
| 305 | hydraulic control portion |
| 306 | brake |
| 307 | tire |
| 311 | capacitor block |
| 312 | control circuit portion |
| 313 | connector |
| 314 | input/output connector |
| 315 | case |
| 315a | lower case |
| 315b | upper cover |
| 316 | capacitor |
| 316a, 316b | lead wire |
| 317 | holder |
| 317a, 317b, 317c, 317d | height regulation boss |
| 318 | circuit board |
| 319 | resistor |
| 320 | cylindrical housing portion |
| 321 | rib |
| 322 | pawl |
| 322a | arc-shaped holding portion |
| 322b | slit |
| 323 | attaching portion |
| 324 | fixing hole |
| 325 | bottom portion |
| 326 | barrier |
| 327 | barrier |
| 328 | regulation wall |
| 329 | prepared hole |
| 330 | nut |
| 331 | nut |
| 332 | position-regulation guide hole |
| 333 | bracket |
| 334a, 334b | screw-fixing hole |
| 335a, 335b | rise portion |
| 336a, 336b | bolt |
| 337 | slot |

| DESCRIPTION OF REFERENCE NUMERALS USED IN THE DRAWINGS | |
| --- | --- |
| 338a, 338b, 338c | position-regulating guide boss |
| 339a, 339b | screw-fixing hole |
| 340a, 340b, 340c | positioning hole |
| 341a, 341b | latching protrusion |
| 342a, 342b | elastic piece |
| 343a, 343b | prepared screw hole |
| 344a, 344b | screw hole |
| 345a, 345b | screw |

DETAILED DESCRIPTION OF THE PREFERRED EMBODIMENTS

First Exemplary Embodiment

The above-mentioned conventional capacitor unit is used in a state in which the capacitor unit is attached to a case, equipment to be used, or the like, via attaching holes 501b provided on circuit board 501. However, depending upon the attaching state, since entire weight (several hundreds grams to several kilograms) of plurality of capacitors 502 is applied to one circuit board 501, circuit board 501 may be distorted and deformed. Depending upon using conditions, in particular, when vibration is applied, there may be problems that attaching hole 501b on circuit board 501 or circuit board 501 main body may be broken, or crack may occur in a soldering portion for electrically connecting a pair of lead wires 502b and 502c of capacitor 502 to a wiring circuit provided on circuit board 501.

The present invention is made to solve such problems with a prior art capacitor unit. Thus, it is an object of the present invention to provide a capacitor unit having high reliability even when it is used under harsh vibration conditions and in which weight load is not applied to a circuit board.

Hereinafter, a first exemplary embodiment of the present invention is described with reference to drawings.

Figure 2:
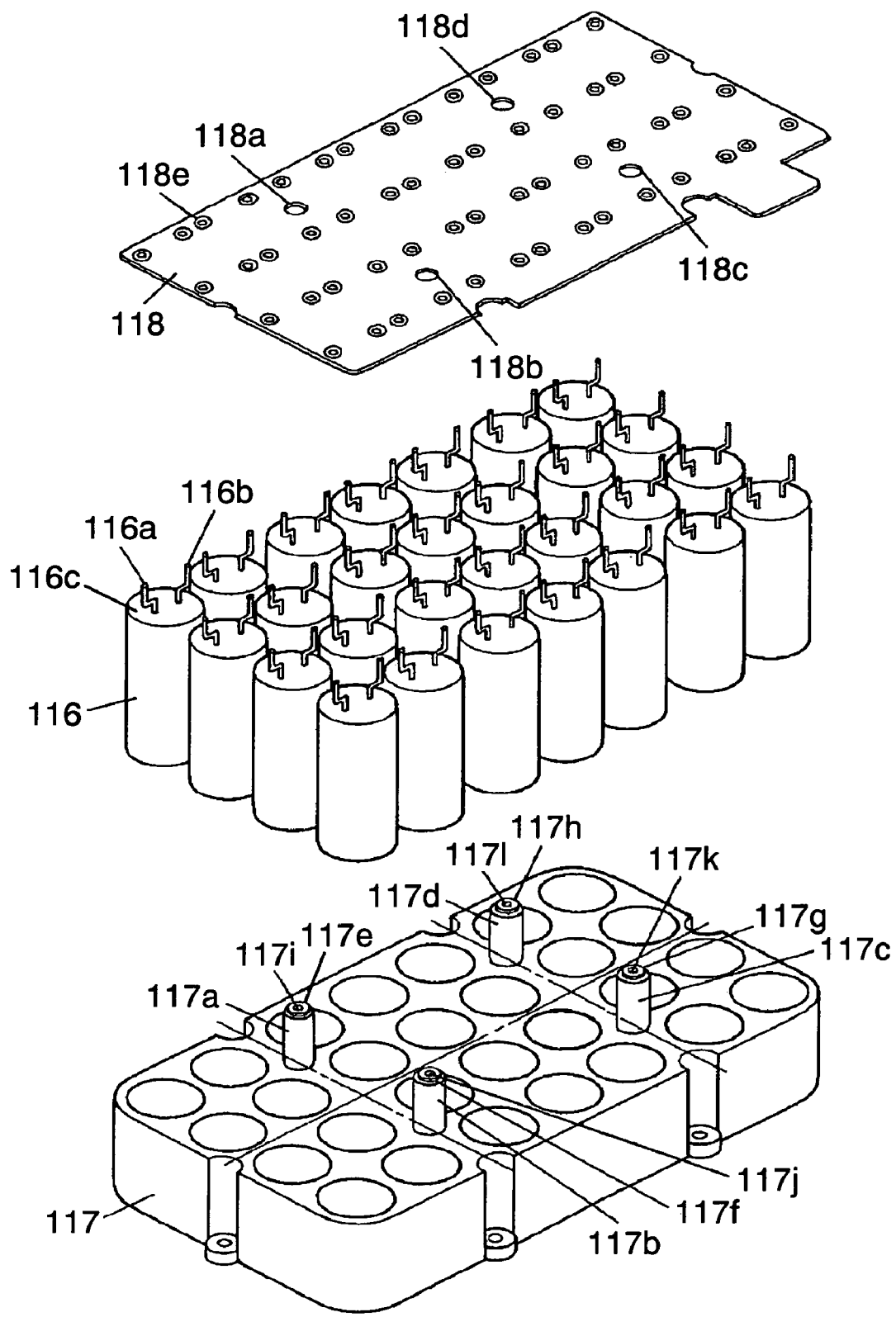
FIG. 2 is an exploded perspective view showing the capacitor unit.

FIG. 1 is an exterior perspective view showing a capacitor unit in a first exemplary embodiment of the present invention, and FIG. 2 is an exploded perspective view showing the capacitor unit.

Capacitor 116 has, on its upper surface, lead wire 116a having a positive polarity and lead wire 116b having a negative polarity which extend in the same direction. In the description of this exemplary embodiment, 28 capacitors are configured in a way in which seven series-connected capacitors are arranged in four parallel lines. A capacitor to be described has the following configuration: when allowable voltage per capacitor is 2V, in order to be applied to a 14V system, seven capacitors are connected in series, and in order to secure necessary electric charge, the seven series-connected capacitors are arranged in four parallel lines.

Holder 117 stably retains the above-mentioned 28 capacitors 116 in a way in which seven series-connected capacitors are arranged in four parallel lines. At this time, a plurality of capacitors 116 are assembled by using a jig, etc. so that the heights of upper surfaces 116c from which lead wires 116a and 116b extend are substantially uniform in 28 capacitors.

On circuit board 118, a circuit pattern, for connecting a plurality of capacitors 116 in a way in which seven series-connected capacitors are arranged in four parallel lines, is formed. Holder 117 is provided with four height regulation bosses 117a, 117b, 117c and 117d in order to keep the height of circuit board 118 at a predetermined height. Thus, the positional relation between circuit board 118 and upper surfaces 116c of 28 capacitors 116 can be maintained substantially the same.

Herein, on the tip of height regulation bosses 117a to 117d of holder 117, positioning protrusions 117e, 117f, 117g and 117h having diameters smaller than those of the regulation bosses are formed and fitted into holes 118a, 118b, 118c and 118d provided on the corresponding positions on circuit board 118. Thus, the positional relation between capacitors 116 and circuit board 118 is devised to be kept appropriately.

Furthermore, on positioning protrusions 117e to 117h of holder 117, screw holes 117i, 117j, 117k and 117l for screw-fixing are formed concentrically. Herein, positioning protrusions 117e to 117h are formed so that the height dimensions thereof are slightly smaller than the thickness of circuit board 118. Circuit board 118 is assembled in this configuration and then fixed with screws, thereby enabling holder 117 and circuit board 118 to fix to each other stably.

Furthermore, each of lead wires 116a and 116b of capacitor 116 is bent at approximately the intermediate position toward circuit board 118, which makes it possible to substantially increase the length of lead wires 116a and 116b as compared with the case where straight lead wires (not shown) are mounted.

Although the assembling procedure is not particularly described, in a state in which assembling is carried out in the above-mentioned configuration, lead wires 116a and 116b of 28 capacitors 116 are soldered to 56 soldering land portions 118e formed on circuit board 118 so as to be electrically connected thereto.

Next, a method of retaining capacitors 116 by holder 117 of capacitor unit 115 is described with reference to FIGS. 3 and 4.

The use in, for example, a vehicle, etc. is accompanied with large vibration caused by vibration of engine or road conditions, etc. while driving a vehicle. Therefore, much toughness to vibration or shock is required. When capacitors 116 are vibrated by this vibration up and down or left and right, much load is applied to soldering land portions 118e of circuit board 118, which may deteriorate the reliability of the soldering portion.

Thus, in this exemplary embodiment, capacitors 116 are fixed by holder 117 so that they are not vibrated up and down or right and left due to external vibration factors. The detail description thereof follows.

Figure 3:
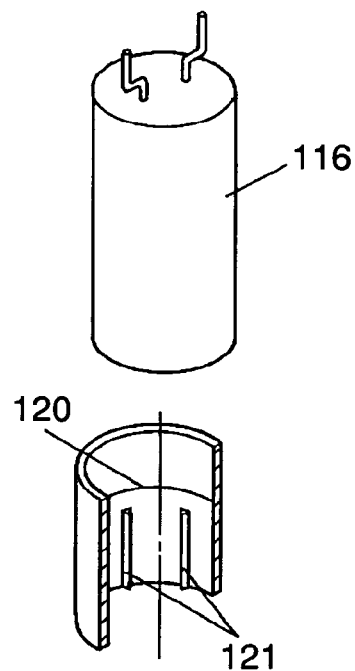
FIG. 3 is a sectional perspective view showing a cylindrical housing portion of a holder of the capacitor unit.

FIG. 3 is a sectional perspective view showing one of the 28 capacitor holding portions formed in holder 117. The diameter of cylindrical housing portion 120 of holder 117 into which capacitor 116 is inserted is slightly larger than the diameter of capacitor 116. On the inner surface of cylindrical housing portion 120, two or more ribs 121 are provided in the longitudinal direction. The rib may be formed in various shapes. However, it is desirable that the rib is formed in a triangle or an arc shape. The diameter of a shape obtained by connecting the apexes of two or more ribs 121 is set slightly smaller than the diameter of capacitor 116. Therefore, when capacitor 116 is inserted in this state, capacitors 116 can be press-fitted and retained by the elastic deformation of cylindrical housing portion 120 of holder 117 and the exterior of capacitor 116.

The retaining force at this time is set to 0.1 kgf to 10 kgf for static load in the direction in which capacitor 116 is pulled out. This values are determined as follows, that is to say, the minimum retaining force is determined from maximum acceleration from the vibration conditions of vehicle, weight of capacitor 116 and allowable stress that does not cause soldering crack in the soldering portion 118e of circuit board 118; and maximum retaining force is determined from allowable load of deformation of the exterior of capacitor 116 and internal destruction.

Figure 4:
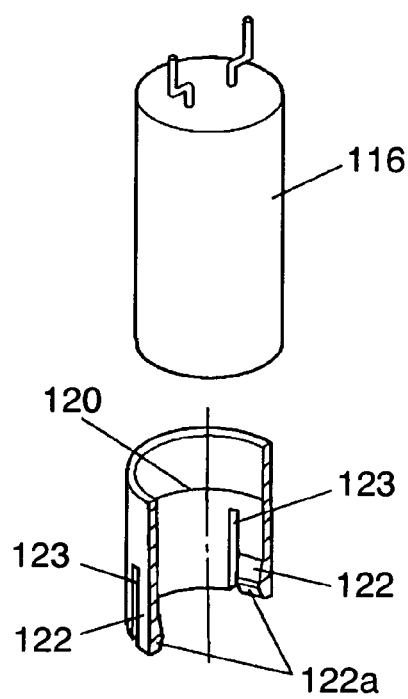
FIG. 4 is a sectional perspective view showing another cylindrical housing portion of a holder of the capacitor unit.

FIG. 4 is a view showing an alternative method of retaining a capacitor. Similar to FIG. 3, FIG. 4 is a sectional perspective view showing one of the 28 capacitor holding portions formed in holder 117. On the side wall of cylindrical housing portion 120 of capacitor 116, slits 123 are provided at left and right sides and two holding pawls 122 that can be elastically deformed are provided on two positions diagonal to each other. On the tip of holding pawl 122, arc-shaped holding portion 122a is provided. The dimension of the diameter connecting two arc-shaped holding portions 122a is set to be smaller than the diameter of capacitor 116.

When capacitor 116 is inserted in this state, by flexure of two holding pawls 122, capacitor 116 is retained.

The retaining force at this time is set to 0.1 kgf to 10 kgf for static load in the direction in which capacitor 116 is pulled out as in the case of press-fitting with ribs. The use of holding pawl 122 employs the principle of cantilever spring, and by adjusting the width of the pawl or length of the slit, the retaining force can be adjusted.

According to the above-mentioned configuration, 28 capacitors 116 can be retained reliably, and the up-and-down and left-and-right positional relation with respect to circuit board 118 can be kept at constant. Furthermore, by bending the shape of lead wires 116a and 116b, stress applied to the soldering portion can be made uniform and small.

In particular, environment of vehicles, etc. is very harsh, and vibration resistance and wide range of operating temperature are required. With the configuration as mentioned above, such required performances can be satisfied.

As described above, according to the capacitor unit of the present invention, a plurality of capacitors are mounted on a circuit board on which a circuit pattern for connecting is formed; the body parts of the capacitors are sandwiched and retained by a holder provided with a plurality of cylindrical housing portions; and the circuit board is also fixed to a plurality of height regulation bosses provided on the holder. Thus, the entire weight of the plurality of capacitors is supported by the holder and the circuit board is also fixed to and integrated with the holder, and thereby weight load is not applied to the circuit board. Consequently, the circuit board is not destructed, and a capacitor unit having high reliability can be provided.

Furthermore, according to the capacitor unit of the present invention, the inner diameter of the cylindrical housing portion of the holder is slightly larger than the outer diameter of the capacitor, and the capacitor is press-fitted and retained by two or more ribs provided on the inner surface of the cylindrical housing portion. Thus, the capacitor can be retained more reliably and the stability of retaining force can be achieved.

Furthermore, according to the capacitor unit of the present invention, the inner diameter of the cylindrical housing portion of the holder is slightly larger than the outer diameter of the capacitor, and the capacitor is retained by two or more elastic pieces composed of slit and protecting pawl provided on the inner surface of the cylindrical housing portion. Thus, it is possible to retain the capacitor reliably and improve the retaining force remarkably.

Furthermore, according to the capacitor unit of the present invention, it is specified that the retaining force of the capacitor is 0.1 kgf to 10 kgf for the force in the direction in which the capacitor is pulled out. In addition, it is also specified that the retaining force when vibration conditions of a vehicle, weight of capacitor to be retained, allowable stress of the soldering portion to the circuit board, insertion force of a capacitor to the cylindrical housing portion, and the like, are considered. By managing them, long-term reliability can be secured.

Furthermore, according to the capacitor unit of the present invention, at least two of the height regulation bosses have positioning protrusions of the circuit board and the circuit board is provided with holes corresponding to the protrusions, each having a position-regulation function. Thus, positional relation between the position of the lead wires of capacitor and the circuit board becomes stable, enabling the stress in the soldering portion of the lead wires of the capacitor generated by the difference in thermal expansion of components due to the change in environment temperatures, thus making it possible to allow the quality of the soldering portion to be uniform.

Furthermore, according to the capacitor of the present invention, at least two of the height regulation bosses have screw holes for fixing the circuit board and fix the circuit board with screws. Thus, the holder and the circuit board can be fixed at a predetermined height. At the same time, by fixing the circuit board with screws before soldering the lead wires to the circuit board, the length of lead wires of the capacitor connected to the circuit board can be kept at constant. Consequently, fabrication and soldering operation becomes easy.

Furthermore, according to the capacitor unit of the present invention, the height regulation boss has positioning protrusion and screw hole which are provided concentrically and the height of the positioning protrusion is lower than the thickness of the circuit board. This configuration makes it possible to carry out both positioning and screwing at one position and to prevent backlash of a circuit board after screwing reliably.

Furthermore, the capacitor unit of the present invention has a configuration in which the lead wires, which extend in the same direction, are bent at the intermediate position toward a portion fixed to the circuit board by soldering so that the length from an exit of the capacitor to the fixed portion of the circuit board is substantially longer. Thus, stress in the soldering portion of the lead wires of the capacitor, which is generated by the difference in thermal expansion of components due to the change in the environment temperatures, can be relaxed as compared with the case where straight lead wires connected to the circuit board is used. Thus, the quality of the soldering portion can be improved.

As mentioned above, since the capacitor unit of the present invention has a holder for mechanically fixing the plurality of capacitors to the circuit board, the weight load of the plurality of capacitors is not applied to the circuit board. Therefore, it is possible to dissolve problems that circuit board may be distorted and deformed due to the weight load of the plurality of capacitors, the circuit board main body may be broken due to vibration, or crack may occur in the soldering portion of the lead wires of the capacitor and the circuit board.

Second Exemplary Embodiment

In the above-mentioned conventional capacitor unit, depending upon the attaching state, there may be problems that entire weight (several hundreds grams to several kilograms) of plurality of capacitors 502 is applied to one circuit board 501, so that circuit board 501 may be distorted and deformed; and depending upon using conditions, in particular, when vibration is applied, attaching hole 501b of wiring board 501 and circuit board 501 main body may be broken. Alternatively, there is a problem that crack may occur in the soldering portion for electrically connecting pair of lead wires 502b and 502c of capacitor 502 to a circuit formed on circuit board 501. Furthermore, when abnormal current flows in capacitor 502, explosion-proof valve 502d provided on metal case 502a of capacitor 502 operates, driving electrolyte, with which capacitor device housed inside of metal case 502a is impregnated, is released from explosion-proof valve 502d. However, this released driving electrolyte flies around, which may cause short-circuit. In the worst case, other electronic equipment, etc. attached in adjacent thereto may be similarly short-circuited.

The present invention was made to solve such problems with a prior art capacitor unit. Thus, it is an object of the present invention to provide a capacitor unit having high reliability in which weight load is not applied to a circuit board and which does not cause short-circuit defect even when an explosion-proof valve operates.

Hereinafter, a second exemplary embodiment of the present invention is described with reference to drawings.

Figure 5:
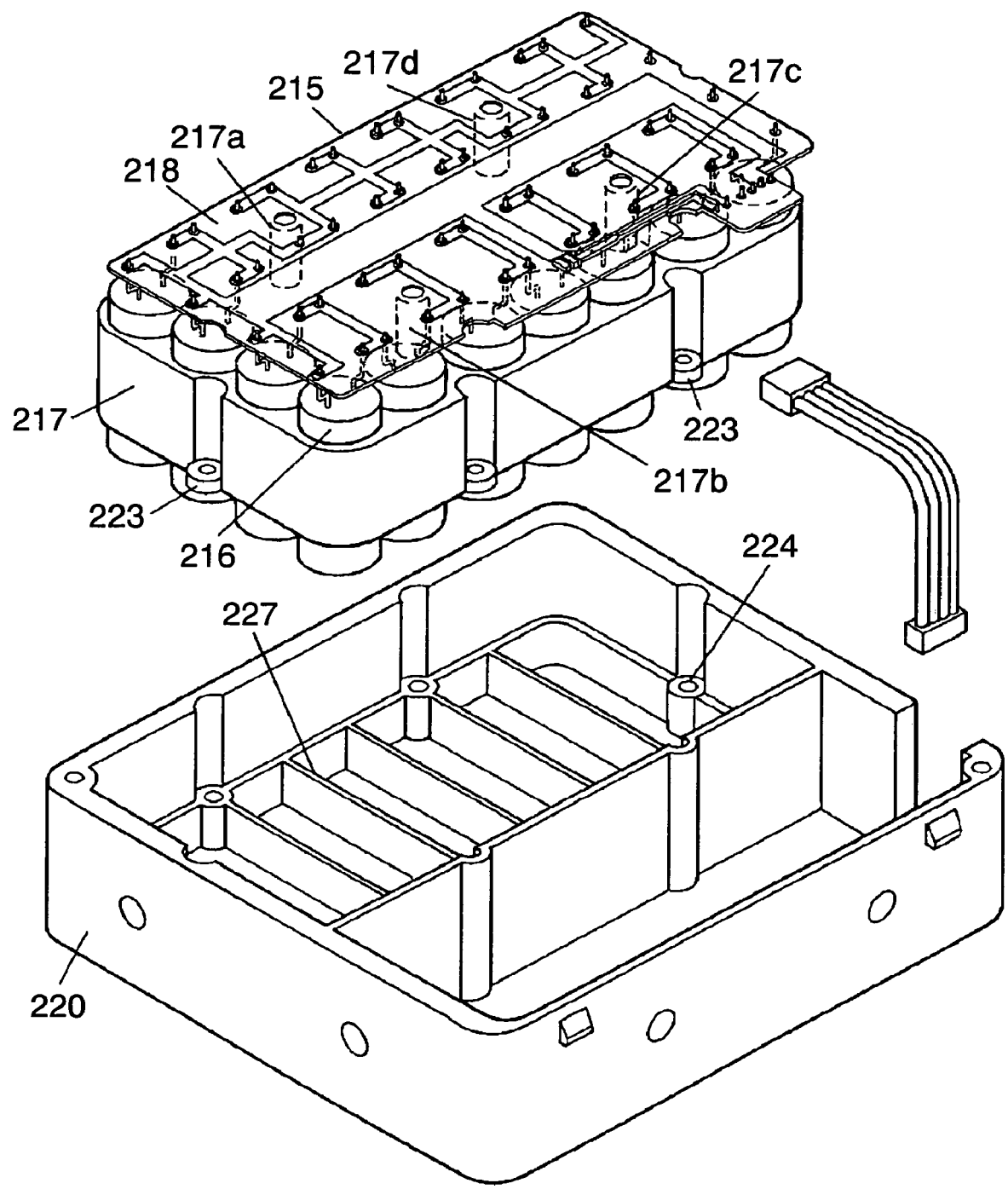
FIG. 5 is an exploded perspective view showing a capacitor unit in an exemplary embodiment of the present invention.
Figure 6:
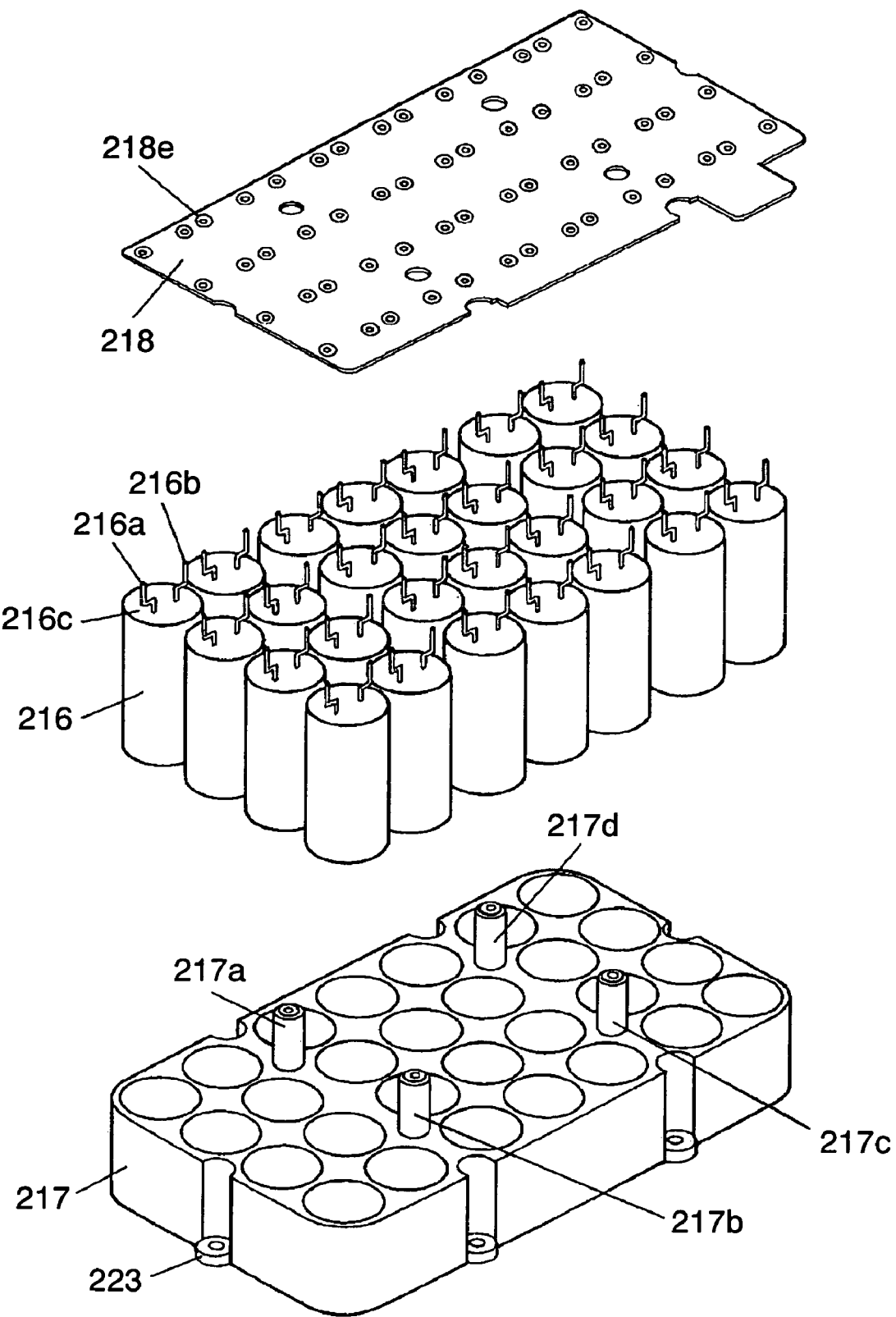
FIG. 6 is an exploded perspective view showing a capacitor block in an exemplary embodiment of the present invention.

FIG. 5 is an exterior perspective view showing a capacitor unit in an exemplary embodiment of the present invention; and FIG. 6 is an exploded perspective view showing the capacitor block.

Capacitor 216 has, on its upper surface, lead wire 216a having a positive polarity and lead wire 216b having a negative polarity which extend in the same direction. In the description of this exemplary embodiment, 28 capacitors are configured in a way in which seven series-connected capacitors are arranged in four parallel lines. A capacitor to be described has the following configuration: when allowable voltage per capacitor is 2V, in order to be applied to a 14V system, seven capacitors are connected in series, and in order to secure necessary electric charge, the seven series-connected capacitors are arranged in four parallel lines.

Holder 217 stably holds the above-mentioned 28 capacitors 216 in a way in which seven series-connected capacitors are arranged in four parallel lines. At this time, a plurality of capacitors 216 are assembled by using a jig, etc. so that the heights of upper surfaces 216c from which lead wires 216a and 216b extend are substantially uniform in 28 capacitors.

On circuit board 218, a circuit pattern, for connecting a plurality of capacitors 216 in a way in which seven series-connected capacitors are arranged in four parallel lines, is formed. Holder 217 is provided with four height regulation bosses 217a, 217b, 217c and 217d in order to keep the height of circuit board 218 at a predetermined height. Thus, the positional relation between circuit board 218 and upper surfaces 216c of 28 capacitors 216 can be maintained substantially the same.

Although the assembling procedure is not particularly described, in a state in which assembling is carried out in the above-mentioned configuration, lead wires 216a and 216b of 28 capacitors 216 are soldered to 56 soldering land portions 218e formed on circuit board 218 so as to be electrically connected thereto.

Although not shown in the drawings, capacitor 216 is configured by winding a necessary length of activated carbon-coated positive and negative electrodes with an interposed paper called a separator sandwiched therebetween and sealing it in the exterior case together with electrolyte. Because of its nature, under abnormal voltage or temperature, gas is generated from the electrolyte inside and internal voltage is increased. When the internal voltage is beyond the allowable value, rupture (bursting) may occur from the exterior case or a portion that is the most susceptible to pressure. In this state, it is difficult to prohibit the disorder mode when a contingency occurs.

Figure 7:
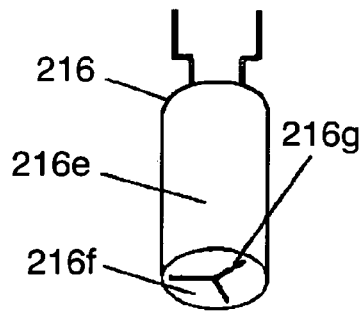
FIG. 7 is an exterior perspective view showing a capacitor in an exemplary embodiment of the present invention.

Therefore, in this exemplary embodiment, as shown in FIG. 7, on bottom portion 216f of exterior case 216e made of aluminum, etc. of capacitor 216, slit 216g is formed. This slit 216g is a groove having a depth of about ½ of the thickness of exterior case 216e and is not a hole in the initial state.

In this state, when electrolyte inside expands due to abnormal voltage, etc., and the voltage is beyond a predetermined voltage, bottom portion 216f of exterior case 216e opens from slit 216g as starting point. Thus, disorder mode in abnormal circumstances is specified and destroyed to the safety side.

Then, a housing method of attaching capacitor block 215 obtained in the above-mentioned configuration to case 220 is described with reference to FIGS. 5, 8 and 9.

Figure 8:
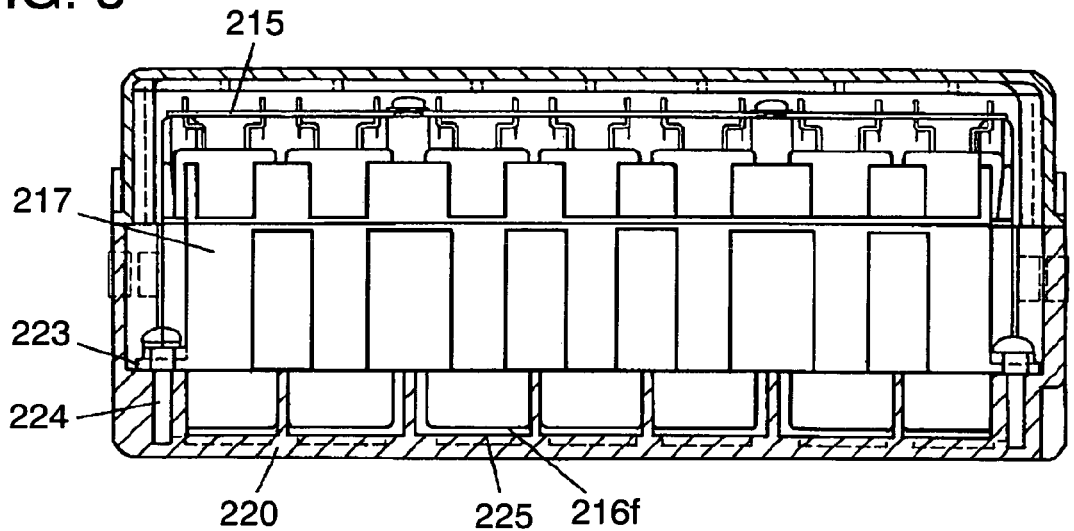
FIG. 8 is a sectional view of a main part showing a state being housed in a case in an exemplary embodiment of the present invention.

FIG. 8 is a sectional view showing a main part of a state in which capacitor block 215 is housed in case 220.

Holder 217 of capacitor block 215 is provided with two or more attaching portions 223 (six parts in this exemplary embodiment) to be attached to case 220 at the outer periphery thereof. Case 220 is provided with fixing holes 224 at the positions corresponding to attaching portions 223. In this state, holder 217 is inserted into and screw-fixed to case 220.

At this time, predetermined space is retained between bottom portion 216f of capacitor 216 disposed in capacitor block 215 and bottom portion 225 of case 220. An object of this configuration is to make interference between bottom portion 216f of capacitor 216 and bottom portion 225 of case 220 so as to avoid load toward soldering portion 218e of circuit board 218. Another object of the configuration is to avoid preventing an opening operation of the above-mentioned slit 216g provided on bottom portion 216f of capacitor 216. Therefore, the space between bottom portion 216f of capacitor 216 and bottom portion 225 of case 220 is a dimension determined considering dimensional variation in the length of capacitor 216 and dimensional change of slit 216g at the time of opening.

Figure 9:
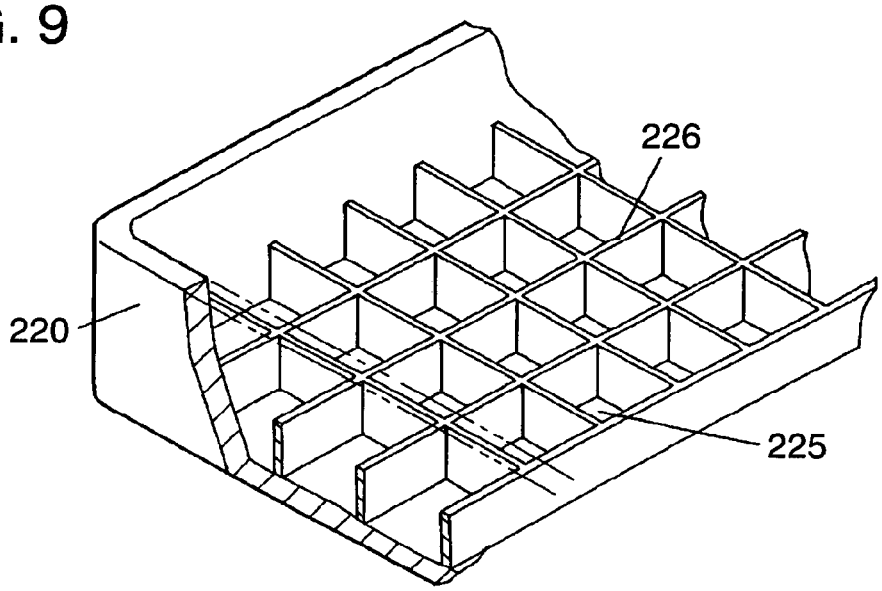
FIG. 9 is a perspective view of a main part showing another inside of the case with partially cut away in an exemplary embodiment of the present invention.

FIG. 9 is a perspective view showing a main part of a bottom portion 225 of case 220 with partially cut away. At positions corresponding to a plurality of capacitors 216 of capacitor block 215, barriers 26 are provided in a lattice from bottom portion 225 of case 220. Thus, if liquid leaks from capacitor 216, the liquid can be prevented from immediately conducting to other capacitors 216. During this time, a monitoring function of capacitor property can determine and diagnose deterioration, thus preventing serious disorder in advance.

Similarly, barriers 227 provided inside case 220 shown in FIG. 5 prevent liquid from conducting between capacitors 216 arranged in series. Also with this configuration, the similar effect can be obtained.

As mentioned above, according to the capacitor unit of the present invention, entire weight of a plurality of capacitors is supported by a holder, so that weight load is not applied to a circuit board. At the same time, when a capacitor block is housed in a case, a bottom surface of the capacitor is not interfered with a bottom surface of the case. Therefore, the circuit board is not destroyed and a capacitor unit with high reliability can be provided.

Furthermore, the capacitor unit of the present invention has, at the bottom surface, an opening structure for releasing electrolyte so that internal destruction of the capacitor does not occur in abnormal circumstances. Therefore, it is possible to prevent destruction due to denature of internal electrolyte when an abnormal voltage is applied to the capacitor, thus reducing damage caused by contingencies.

Furthermore, according to the capacitor unit of the present invention, space between the bottom surface of the capacitor and the bottom surface of the case is set so that the opening structure can operate. Thus, the capacitor can carry out the opening operation under abnormal voltage conditions.

Furthermore, according to the capacitor unit of the present invention, barriers are provided in order to prevent liquid from conducting between the neighboring capacitors when opening structure of the capacitor operates and electrolyte leaks out. Thus, even when the capacitor opens, it does not short-circuit to neighboring capacitors, thus enabling serious defect to be prevented.

In particular, environment of vehicles, etc. is very harsh, and vibration resistance and wide range of operating temperature are required. With the configuration as mentioned above, such required performances can be satisfied.

Third Exemplary Embodiment

A conventional method has a shortcoming that the withstand voltage of a capacitor is low due to its nature. Therefore, in order to obtain a necessary voltage, it is necessary to use a plurality of capacitors connected in series. Furthermore, depending upon a necessary energy amount, the series-connected capacitors need to be used in parallel connection. In addition, it is necessary to provide a control circuit for charging and discharging the capacitors.

Although properties of capacitors are being focused, few proposals have been made on a structure capable of enduring the lifetime of a vehicle, etc. as a unit of emergency power supply obtained by integrating a plurality of capacitors and control circuit with each other.

The present invention also solves the above-mentioned problem, and configures a unit of a capacitor block including a plurality of capacitors and a control circuit portion for controlling its charge and discharge, thereby improving the reliability and safety of systems to be used.

Hereinafter, a third exemplary embodiment of the present invention is described with reference to drawings.

Figure 10:
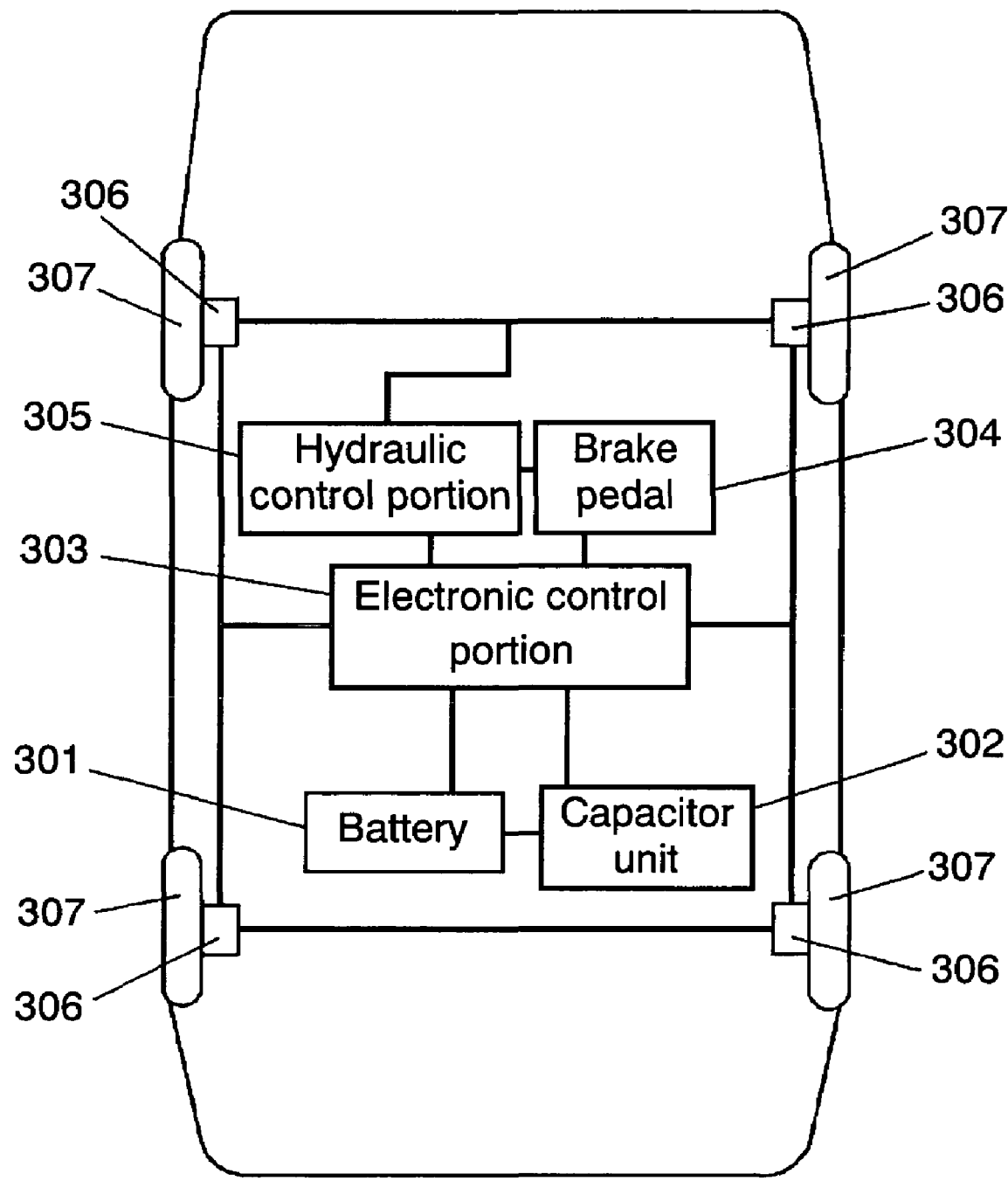
FIG. 10 shows a configuration of an electronic braking system of a vehicle in an exemplary embodiment of the present invention.

FIG. 10 is a view showing a configuration of an electronic control braking system of a vehicle in the exemplary embodiment of the present invention. In FIG. 10, battery 301 for supplying power, capacitor unit 302 as an emergency power supply and electronic control portion 303 for controlling an electronic control braking system are electrically connected, respectively. Furthermore, electronic control portion 303 is also connected to brake pedal 304 and hydraulic control portion 305, and this hydraulic control portion 305 is connected to brake 306 and tire 307.

In the electronic control braking system having such a configuration, when electric power supply from battery 301 is lost due to some contingencies during operation, a function of electronic control braking system is lost. When such contingencies occurs during driving, brake does not work, making it impossible to brake a vehicle. In order to prevent it, capacitor unit 302 is connected, which is intended to release electric charges stored in capacitor unit 302 based on an instruction from electronic control portion 303 so as to operate the electronic control braking system to brake a vehicle when contingencies occur.

This exemplary embodiment relates to capacitor unit 302. The description therefor follows.

Figure 11:
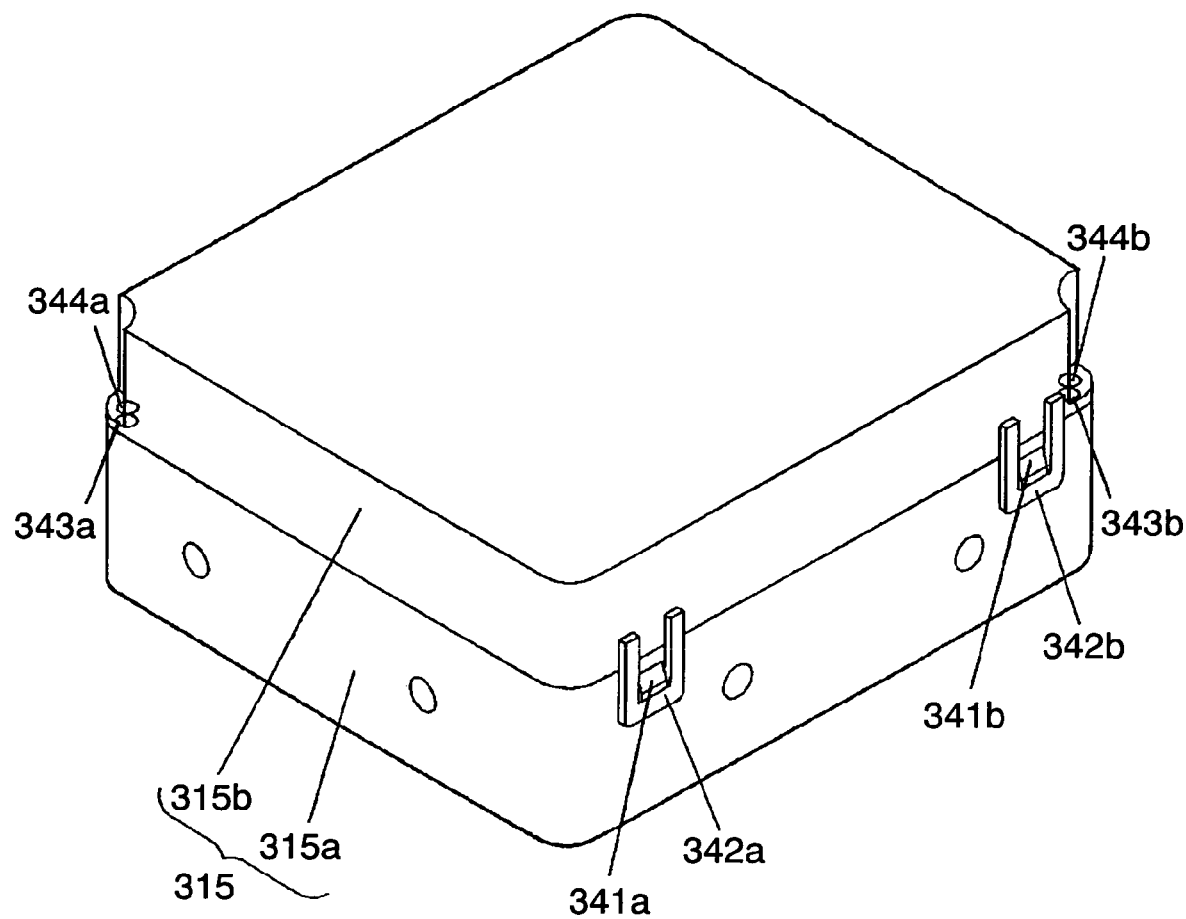
FIG. 11 is an exterior perspective view showing a capacitor unit in an exemplary embodiment of the present invention.
Figure 12:
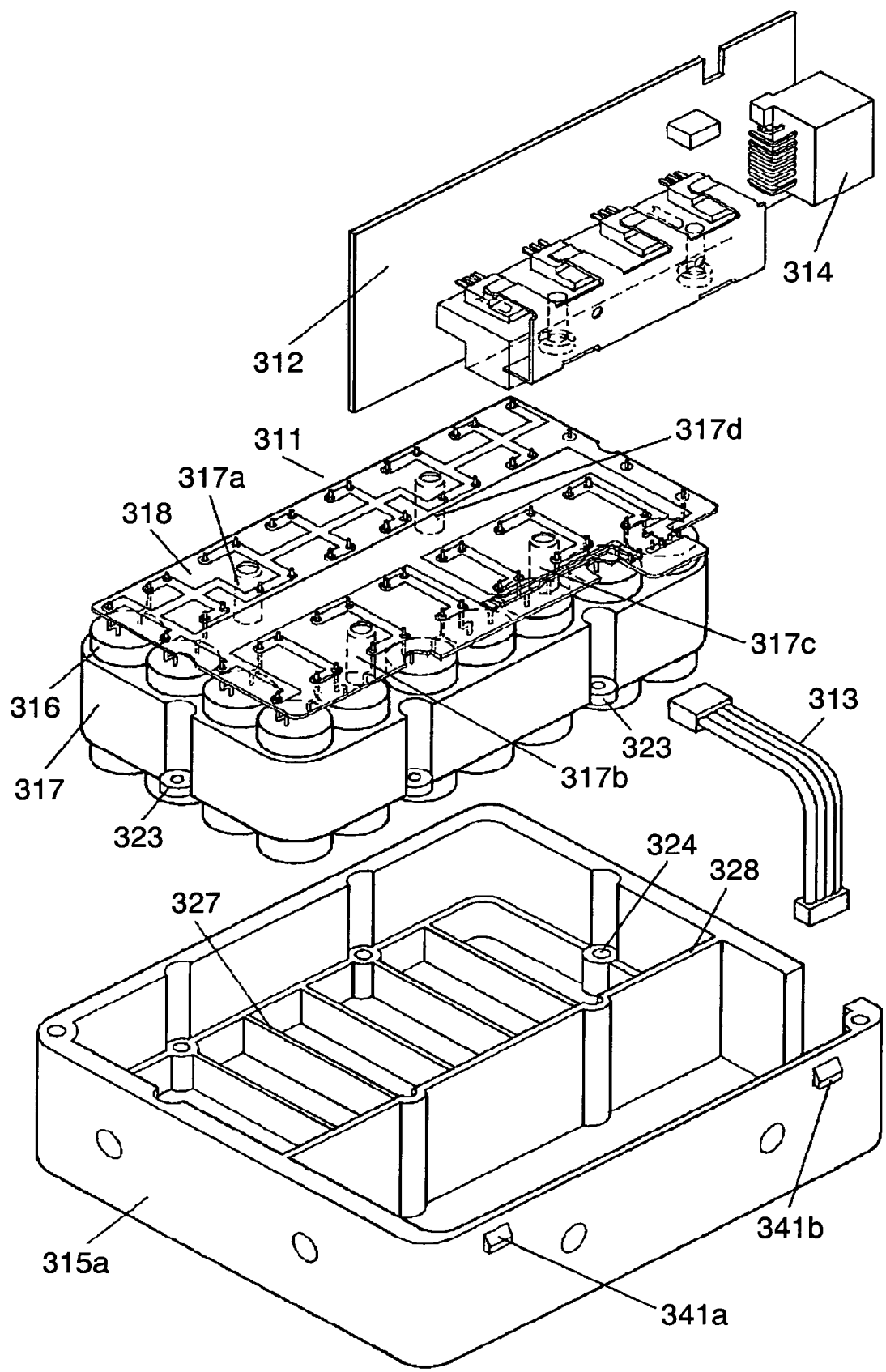
FIG. 12 is an exploded perspective view showing a main part of the capacitor unit.
Figure 13:
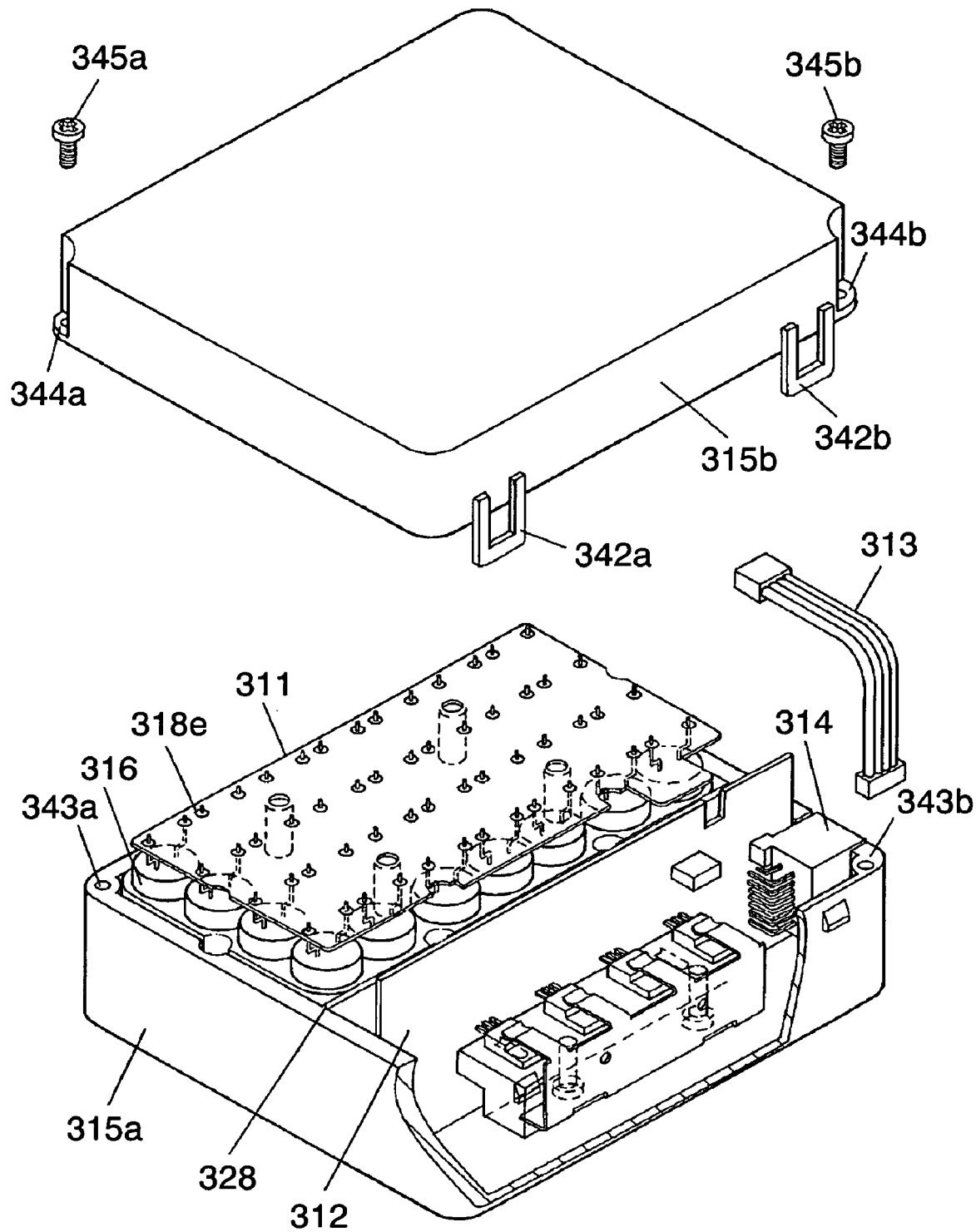
FIG. 13 is an exploded perspective view showing a main part of the capacitor unit in a state in which an upper cover is removed.
Figure 14:
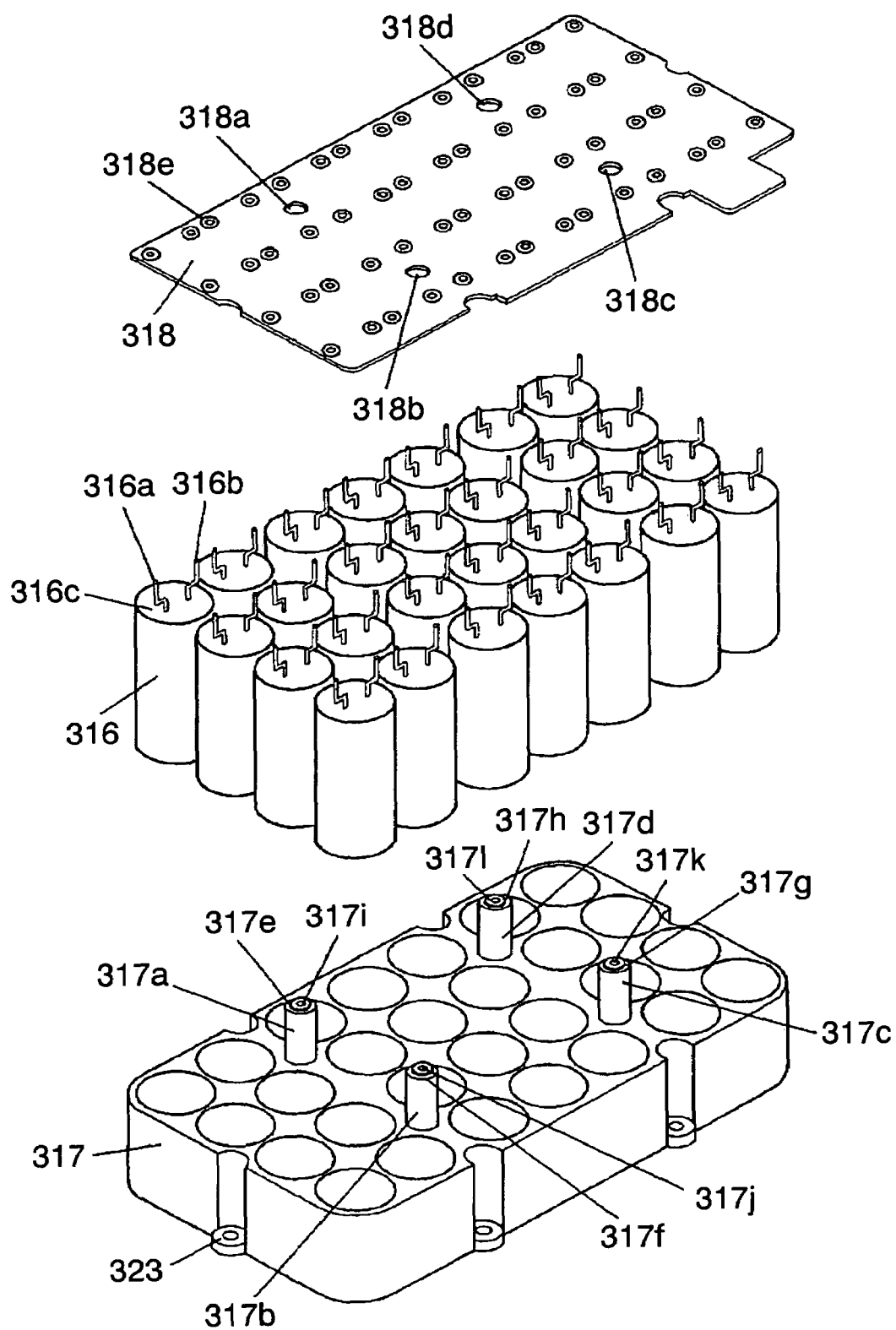
FIG. 14 is an exploded perspective view showing a main part of a capacitor block of the capacitor unit.

FIG. 11 is an exterior perspective view showing a capacitor unit 302. FIGS. 12, 13 and 14 are exploded perspective views of capacitor unit 302, respectively.

In each drawing, connector 313 electrically connects capacitor block 311 to control circuit portion 312. Input/output connector 314 is electrically connected to electronic control portion 303 of electronic control braking system. These are housed in case 315 composed of lower case 315a and upper cover 315b.

Herein, firstly, the configuration of capacitor block 311 is described. Capacitor 316 has, on its upper surface, lead wire 316a having a positive polarity and lead wire 316b having a negative polarity which extend in the same direction. In the description of this exemplary embodiment, 28 capacitors are configured in a way in which seven series-connected capacitors are arranged in four parallel lines. When allowable voltage per capacitor 316 is 2V, in order to be applied to a 14V system, seven capacitors are connected in series, and in order to secure necessary electric charge, the seven series-connected capacitors are arranged in four parallel lines. Thus, the amount of electric charge is improved.

Holder 317 stably retains the above-mentioned 28 capacitors 316 in a way in which seven series-connected capacitors are arranged in four parallel lines. At this time, a plurality of capacitors 316 are assembled by using a jig, etc. so that the heights of upper surfaces 316c from which lead wires 316a and 316b extend are substantially uniform in 28 capacitors.

On circuit board 318, a circuit pattern, for connecting a plurality of capacitors 316 in a way in which seven series-connected capacitors are arranged in four parallel lines, is formed. Holder 317 is provided with four height regulation bosses 317a, 317b, 317c and 317d in order to keep the height of circuit board 318 at a predetermined height. Thus, the positional relation between circuit board 318 and upper surfaces 316c of 28 capacitors 316 can be maintained substantially the same.

Herein, at the tip of height regulation bosses 317a to 317d of holder 317, positioning protrusions 317e, 317f, 317g and 317h having diameters smaller than those of the regulation bosses are formed and fitted into holes 318a, 318b, 318c and 318d provided on the corresponding positions on circuit board 318. Thus, the positional relation between capacitors 316 and circuit board 318 is devised to be kept appropriately.

Furthermore, on positioning protrusions 317e to 317h of holder 317, screw holes 317i, 317j, 317k and 317l for screw-fixing are formed concentrically. Herein, positioning protrusions 317e to 317h are formed so that the height dimensions thereof are slightly smaller than the thickness of circuit board 318. In this configuration, circuit board 318 is assembled and then fixed with a screw, thereby enabling holder 317 and circuit board 318 to fix to each other stably.

Furthermore, each of lead wires 316a and 316b of capacitor 316 is bent at approximately the intermediate position toward circuit board 318, and the length of lead wires 316a and 316b is substantially longer as compared with the case where straight lead wires (not shown) are mounted.

Although the assembling procedure is not particularly described, in a state in which assembling is carried out in the above-mentioned configuration, lead wires 316a and 316b of 28 capacitors 316 are soldered to 56 soldering land portions 318e formed on circuit board 318 so as to be electrically connected thereto.

According to the above-mentioned configuration, 28 capacitors 316 can be retained reliably, and up-and-down and left-and-right positional relation with respect to circuit board 318 can be kept at constant. Furthermore, by bending lead wires 316a and 316b, stress applied to the soldering portion can be made uniform and small. Environment of vehicles, etc. is very harsh, and vibration resistance and wide range of operating temperature are required. With the configuration as mentioned above, such required performances can be satisfied.

Although not shown in the drawings, capacitor 316 is configured by winding a necessary length of activated carbon-coated positive and negative electrodes with an interposed paper called a separator sandwiched therebetween and sealing it in the exterior case together with electrolyte. Because of its nature, under abnormal voltage or temperature, gas is generated from the electrolyte inside and internal voltage is increased. When the internal voltage is beyond the allowable value, rupture (bursting) may occur from the exterior case or a portion that is the most susceptible to pressure. In this state, it is difficult to prohibit the disorder mode when a contingency occurs.

Herein, capacitor 316 in this exemplary embodiment has the same configuration as capacitor 216 described in the second exemplary embodiment. That is to say, as shown in FIG. 7, on bottom portion 216f of exterior case 216e made of aluminum, etc. of capacitor 216, slit 216g is formed. This slit 216g is a groove having a depth of about ½ of the thickness of exterior case 216e and is not a hole in the initial state.

In this state, when electrolyte inside expands due to abnormal voltage, etc., and the voltage is beyond a predetermined voltage, bottom portion 216f of exterior case 216e opens from slit 216g as starting point. Thus, disorder mode at the abnormal time is specified and destroyed to the safety side.

Next, capacitor 316 has lead wire 316a having a positive polarity and lead wire 316b having a negative polarity. A circuit pattern of wring board 318 on which lead wires 316a and 316b are mounted is configured so that at the side the distance between the neighboring lead wires is shorter, lead wires certainly have the same potential (positive to positive, or negative to negative). The reason why lead wires 316a and 316b are configured as mentioned above is to prevent the short circuit between lead lands due to migration generated in humidity environment, etc. In general, when such a processing is not applied, the soldering portion needs to be covered with moisture-proof coat, etc. This exemplary embodiment has a merit that such moisture-proof coat is not necessary.

Figure 15:
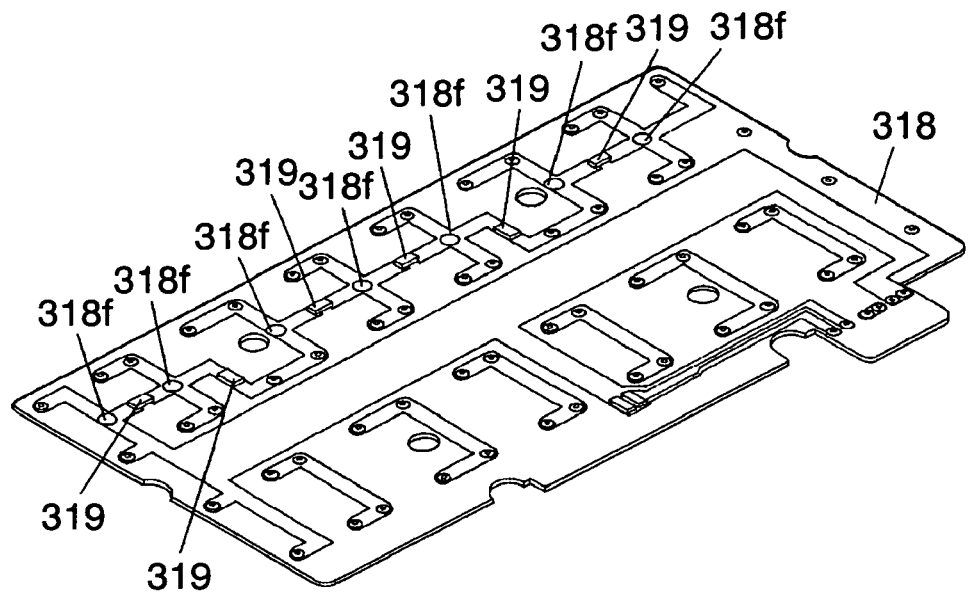
FIG. 15 is a view showing a circuit board of the capacitor unit.

FIG. 15 shows a pattern of circuit board 318. To circuit board 318, resistor 319 for balancing so that each capacitor connected in series is uniformly charged at the time of charging. As mentioned above, since allowable voltage of capacitor 316 is as low as about 2V, when variation occurs in voltages to be applied to each capacitor 316 at the time of 14V charging, capacitor 316 to which higher voltage is applied is earlier deteriorated in its performance. By connecting resistor 319 for balancing voltage, voltage applied to each capacitor 316 can be made uniform and it is possible to prevent abnormal voltage from being applied intensively to few capacitors 316, thus enabling the long-term stable use.

Circuit board 318 is provided with test point 318f for monitoring voltage and characteristics (capacitance and resistance) every parallel block of capacitors 316. Thus, at the stage that a capacitor block is made, characteristics can be checked, the variations of voltage and capacitance can be grasped initially. Furthermore, although not shown in detail, control circuit portion 312 is also provided with a function for checking properties as mentioned above. When the abnormality is found in the property values due to lifetime, etc., it is transmitted as a DIAG signal from a built-in microcomputer to electronic control portion 303 of an electronic control braking system. Based on the results, procedures such as lightening of indicator of vehicles, exchange of capacitor unit 302, and the like, are carried out.

Next, a method of retaining capacitors 316 by holder 317 of capacitor block 311 is described in detail with reference to FIGS. 3 and 16.

The use in, for example, a vehicle, etc. is accompanied with large vibration caused by vibration of engine or road conditions, etc. while driving a vehicle. Therefore, much toughness to vibration or shock is required. When capacitors 316 are vibrated by this vibration up and down or left and right, much load is applied to soldering land portions 318e of circuit board 318, which may deteriorate the reliability of the soldering portion.

Then, in this exemplary embodiment, capacitors 316 are fixed by holder 317 so that they are not vibrated up and down or right and left due to external vibration factors. The detail description thereof follows.

FIG. 3 is described before and therefore the detail description thereof is omitted herein. FIG. 16 is mainly described.

Figure 16:
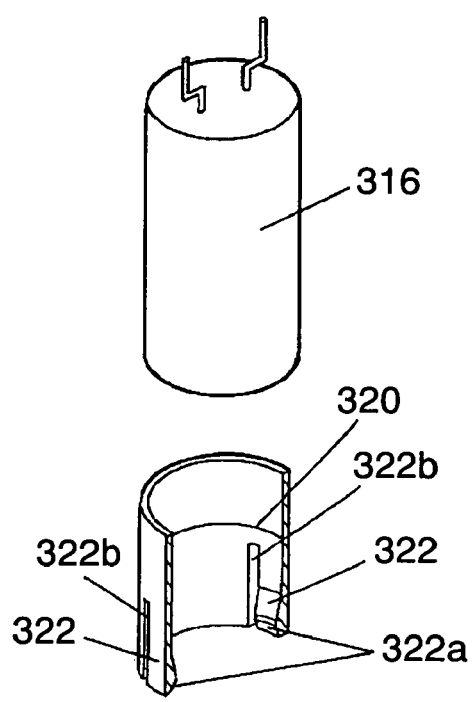
FIG. 16 is a sectional perspective view showing a main part of a holder of the capacitor block.

FIG. 16 is a view showing an alternative method of retaining a capacitor. Similar to FIG. 3, FIG. 16 is a sectional perspective view showing one of the 28 capacitor holding portions formed on holder 317. On the side wall of cylindrical housing portion 320 of capacitor 316, slits 322b are provided at both left and right sides and two holding pawls 322 that can be elastically deformed are provided on two positions diagonal to each other. On the tip of holding pawl 322, arc-shaped holding portion 322a is provided. The dimension of the diameter connecting two arc-shaped holding portions 322a is set to be smaller than the diameter of capacitor 316.

When capacitor 316 is inserted in this state, by two flexure of holding pawls 322, capacitor 316 is retained.

The retaining force at this time is set to 0.1 kgf to 10 kgf for static load in the direction in which capacitor 316 is pulled out similar to the case of press-fitting with ribs. The use of holding pawl 322 employs the principle of cantilever spring, and by adjusting the width of the pawl or the length of the slit, the retaining force can be adjusted.

Since in the case of press-fitting with ribs shown in FIG. 3, the retaining force is dependent upon the elastic deformation of cylindrical resin, the change in the retaining force caused by the dimensional change is increased. Therefore, it is necessary to enhance the precision of dimension. On the other hand, when a retaining piece shown in FIG. 16 is used, it is possible to suppress the change in the retaining force caused by the dimensional change as compared with the case shown in FIG. 3, and therefore the dimension is rough and the stable retaining force can be obtained.

Next, a method for housing capacitor block 311 obtained in the above-mentioned configuration and control circuit portion 312 into case 315 is described in detail.

Figure 17:
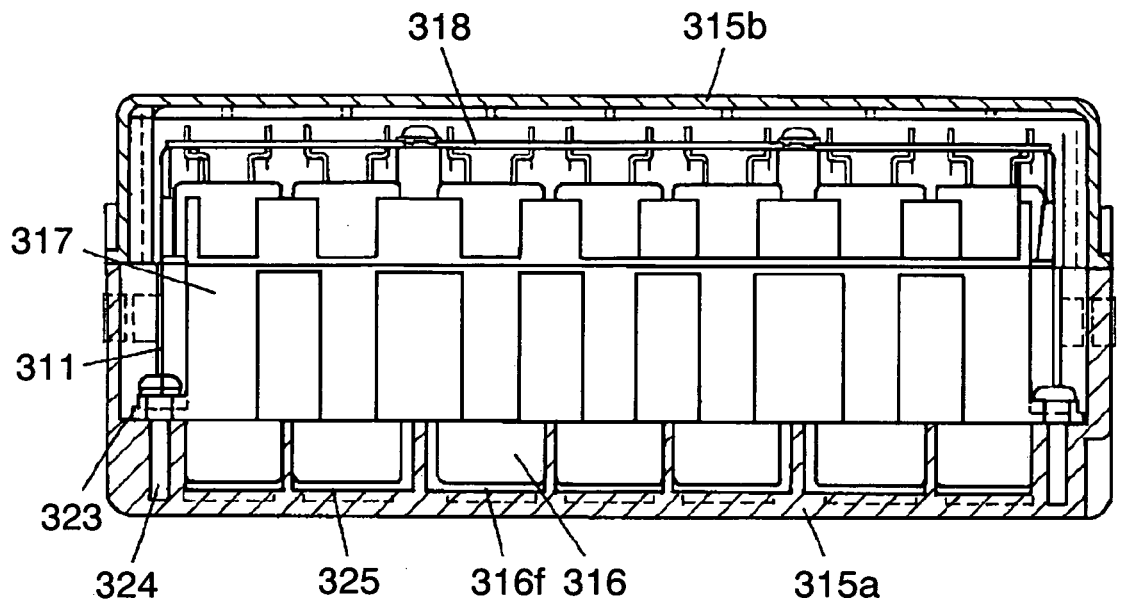
FIG. 17 is a sectional view showing a main part of the capacitor unit.

FIG. 17 is a sectional view showing a main part of a state being housed in a case. Case 315 is configured by lower case 315a and upper cover 315b. Holder 317 of capacitor block 311 is provided with two or more attaching portions 323 (six parts in this exemplary embodiment) to be attached to case 315 at the outer periphery thereof. Lower case 315a is provided with fixing holes 324 at positions corresponding to attaching portions 323. In this state, holder 317 is inserted into and screw-fixed to lower case 315a.

At this time, predetermined space is retained between bottom portion 316f of capacitor 316 disposed in capacitor block 311 and bottom portion 325 of lower case 315a. An object of this configuration is to make interference between bottom portion 316f of capacitor 316 and bottom portion of lower case 315a so as to avoid load toward soldering land portion 318e of circuit board 318. Another object of this configuration is to avoid preventing an opening operation of the above-mentioned slit provided to bottom portion 316f of capacitor 316. Therefore, space between bottom portion 316f of capacitor 316 and bottom portion 325 of lower case 315a is a dimension determined considering dimensional variation in the length of capacitor 316 and dimensional change of the slit at the time of opening.

Figure 18:
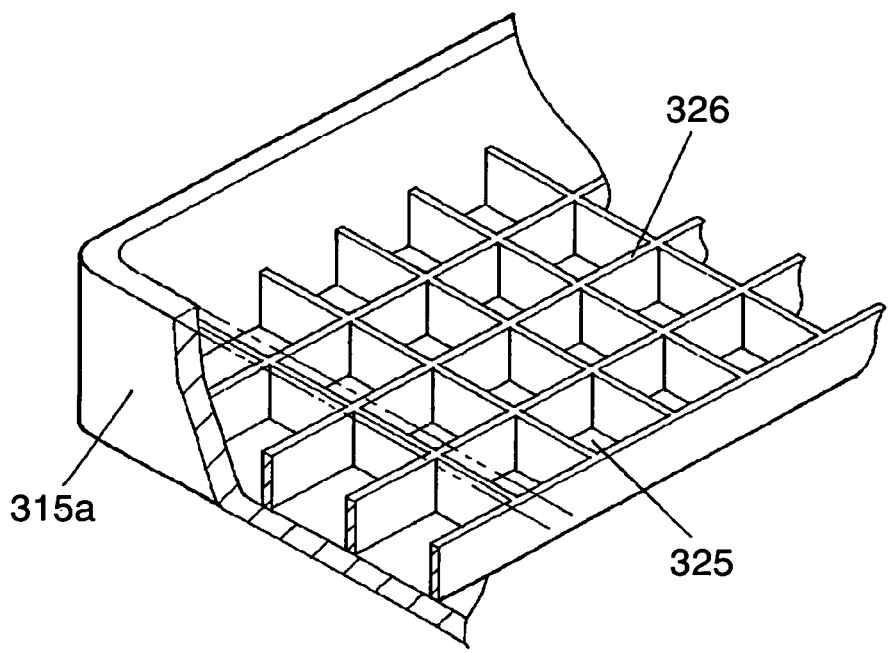
FIG. 18 is a perspective view showing a main part of a lower case of the capacitor unit.

FIG. 18 is a perspective view showing a main part of a bottom portion 325 of lower case 315a with partially cut away. At positions corresponding to a plurality of capacitors 316 of capacitor block 311, barriers 326 are provided in a lattice from bottom portion 325 of lower case 315a. Thus, if liquid leaks from capacitor 316, the liquid can be prevented from immediately conducting to other capacitors 316. During this time, a monitoring function of capacitor property can determine and diagnose deterioration, thus preventing serious disorder in advance.

Similarly, barriers 327 provided inside lower case 315a shown in FIG. 12 prevent liquid from conducting between capacitors 316 arranged in series. Also with this configuration, the similar effect can be obtained.

Next, at the opposite side of capacitor block 311 housed in lower case 315a, control circuit portion 312 is fixed with screws, etc. Lower case 315a is provided with regulation wall 328 having an appropriate height and thickness between the housed capacitor block 311 and control circuit portion 312. Furthermore, capacitor block 311 and control circuit portion 312 are electrically connected to each other by connector 313.

Capacitor block 311 is configured by 28 capacitors 316 which are connected in series or in parallel. In order to maintain the performance, each property is desired to be uniform as much as possible. However, control circuit portion 312 is a circuit for charging and discharging capacitor block 311, and during the process, a substantial amount of heat is generated. By the radiant heat, the temperature of the side near the control circuit portion 312 of capacitor block 311 increases, which may lead to variation in performance. This regulation wall 328 prevents this radiant heat and maintains the quality of capacitor block 311.

Next, the exemplary embodiment for mounting this capacitor unit 302 on a vehicle is described.

Figure 19:
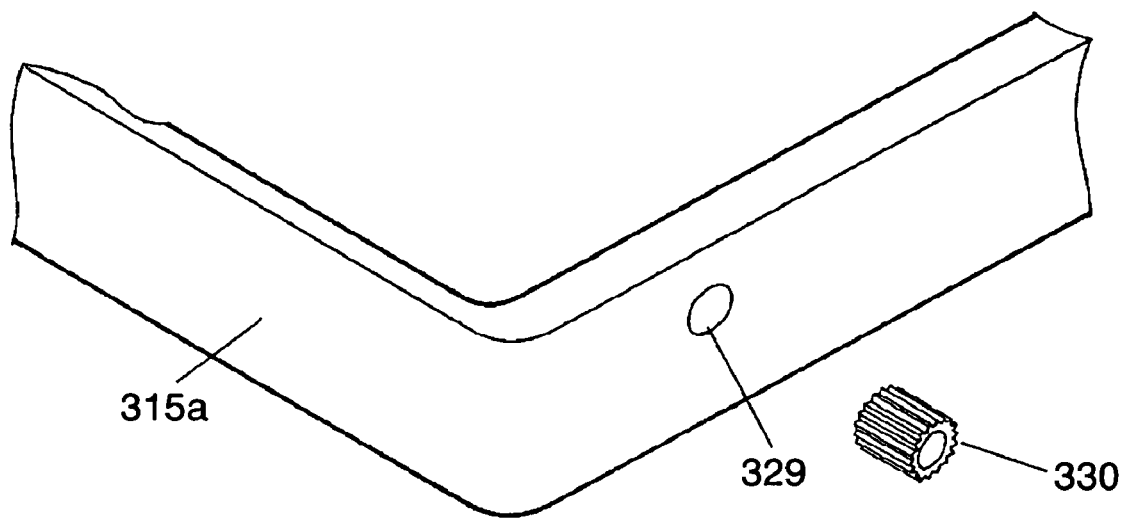
FIG. 19 is a perspective view showing a main part of a lower case of the capacitor unit.

The side surface of lower case 315a is provided with a plurality of nuts 330 to be attached to a body to be fixed. The forming method is shown in FIG. 19. The side surface of lower case 315a is provided with prepared hole 329 for nut press-fitting and nut 330 is press-fitted into prepared hole 329. Nut 330 is a knurled nut with the outer periphery thereof processed in convex and concave shape and has a diameter that is slightly larger than that of prepared hole 329. The dimensional difference thereof is specified from the necessary torque for fixing.

Figure 20:
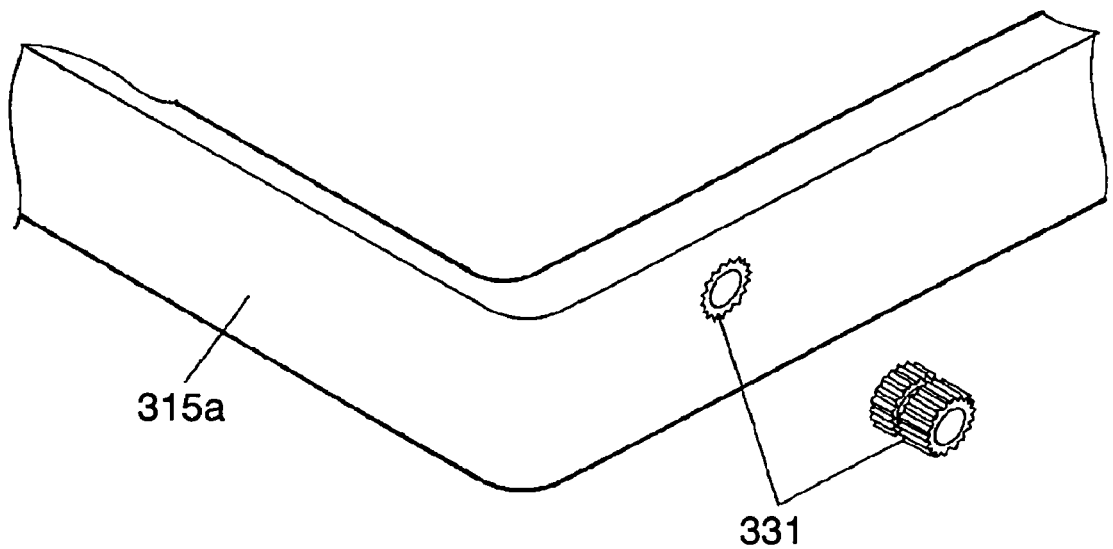
FIG. 20 is a perspective view showing a main part of a lower case of the capacitor unit.

FIG. 20 shows a method for forming nut 331 by insert formation. Nut 331 is formed at the same time when the lower case 315a made of resin is formed. Nut 331 is formed in a shape of knurling at the outer periphery and a circumferential groove is formed in substantially the intermediate part of the knurling. The processed portion of this knurling and groove is filled with resin, and thereby the strength of clamping torque of screws and strength of pulling out the nut are secured.

Figure 21:
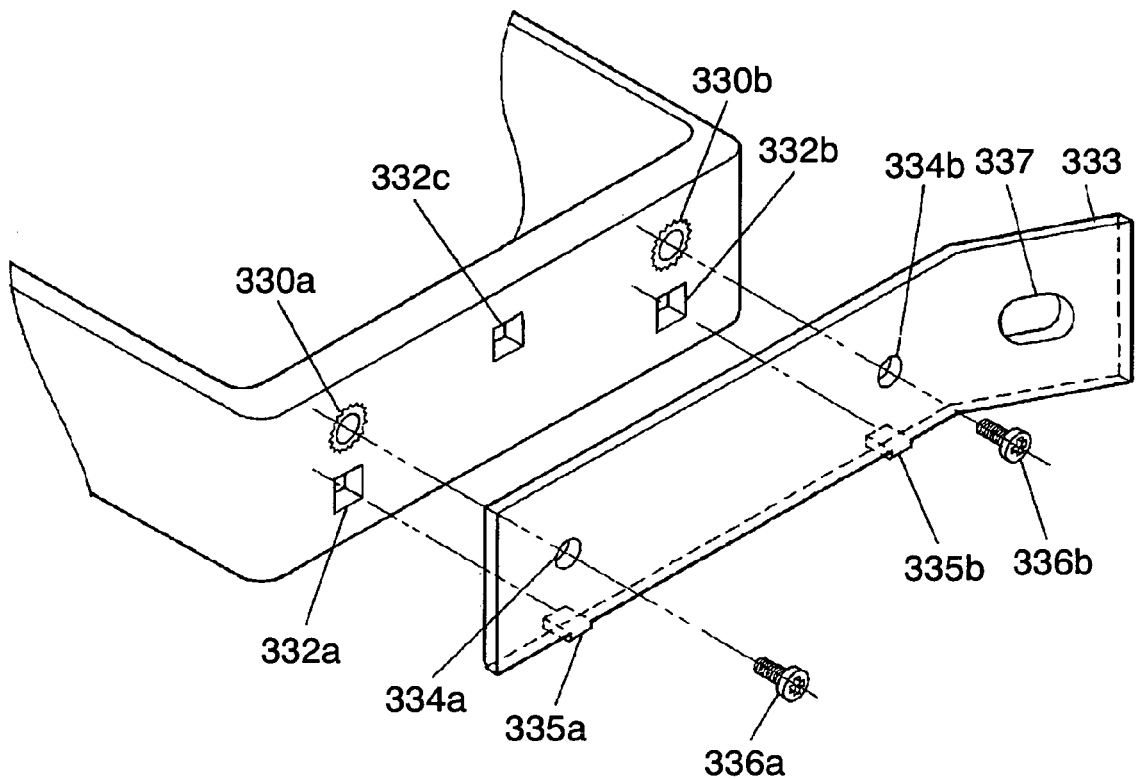
FIG. 21 is a perspective view showing a relation between the lower case and a bracket of the capacitor unit.

FIG. 21 shows the case in which position regulating guide hole 332 is provided in the vicinity of nut 330 or nut 331 which is press-fitted or formed by insertion formation. In this exemplary embodiment, three position-regulation guide holes 332a, 332b and 332c are provided for two nuts 330a and 330b. Bracket 333 is made of a metal plate, etc. On bracket 333, two screw-fixing holes 334a and 334b and two positioning rise portions 335a and 335b are formed. In this state, position-regulation guide holes 332a and 332b is fitted into positioning rise portions 335a and 335b, respectively, and two bolts 336a and 336b are allowed to pass through screw-fixing holes 334a and 334b so as to be fixed to nut 330a and 330b. Slot 337 is formed on a necessary position on bracket 333 and fixed to the attached portion of a vehicle (not shown) by bolts.

Figure 22:
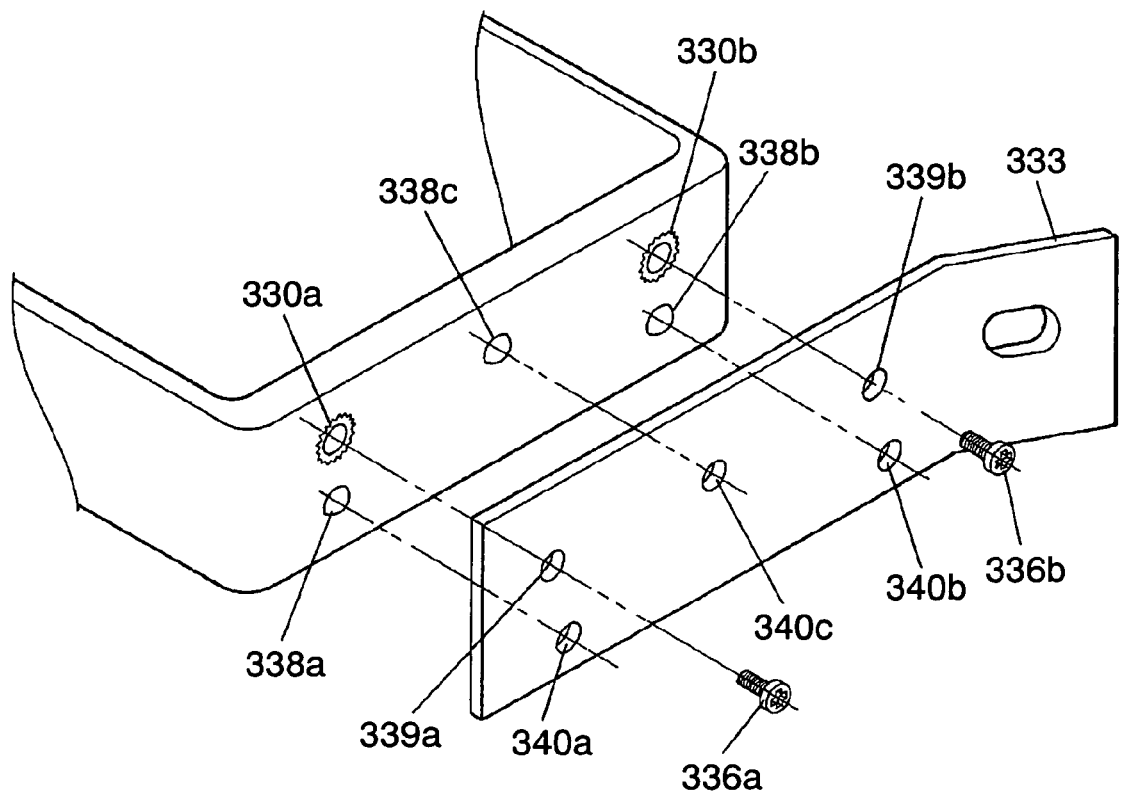
FIG. 22 is a perspective view showing a relation between the lower case and a bracket of the capacitor unit.
Figure 23:
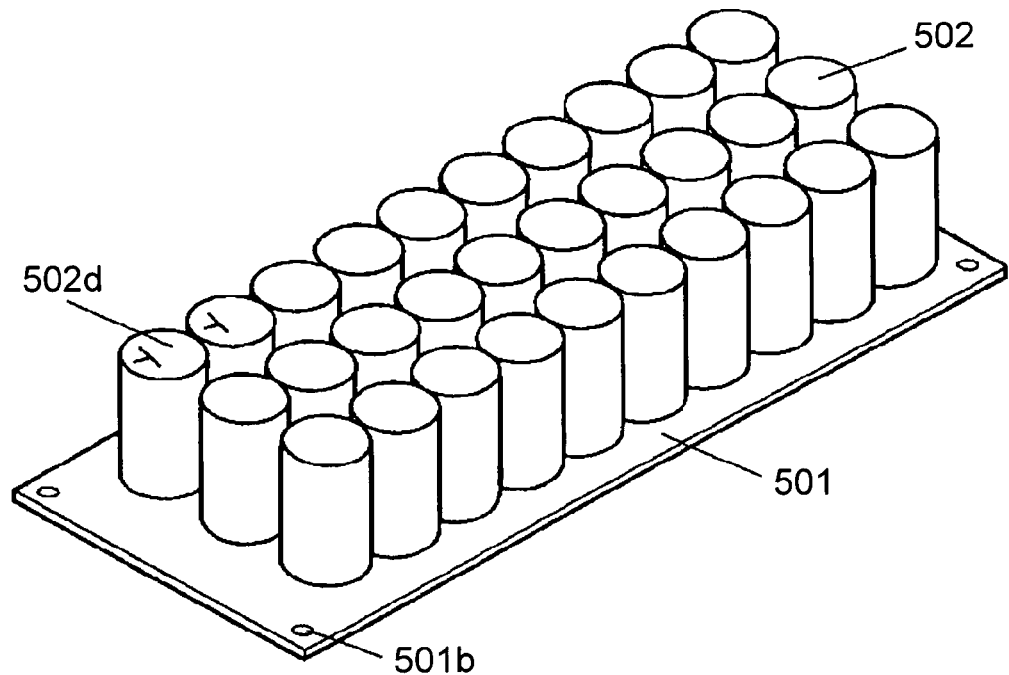
FIG. 23 is a perspective view showing a configuration of a conventional capacitor unit.
Figure 24:
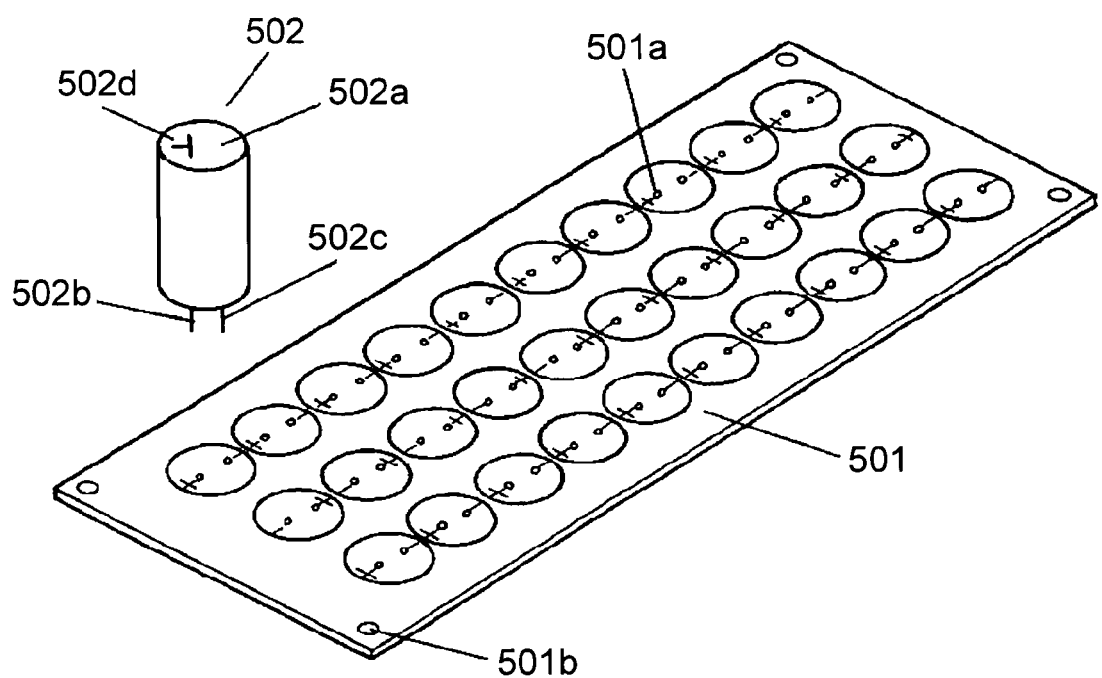
FIG. 24 is a perspective view showing a circuit board used in a conventional capacitor unit.

On the other hand, FIG. 22 shows the case where position-regulation guide bosses 338 are provided in the vicinity of nut 330 or nut 331 press fitted or formed by insertion formation. In this exemplary embodiment, three position-regulation guide bosses 338a, 338b and 338c are provided to two nuts 330a and 330b. On bracket 333, two screw-fixing holes 339a and 339b and positioning holes 340a and 340b are formed. In this state, position-regulation guide bosses 338a, 338b and 338c are respectively fitted into positioning holes 340a, 340b and 340c, and two bolts 336a and 336b are allowed to pass through screw-fixing holes 339a and 339b so as to be fixed to nut 330a and 330b.

Herein, in example shown in FIG. 21, position-regulation guide hole 332c is not used. This is formed because in the attachment to various kinds of vehicles, various shaped brackets can be thought, and in such a case, the larger number of positions for position-regulation is, the wider the selection range of bracket designs becomes. Furthermore, in this exemplary embodiment, the attachment portion is formed on only one surface of lower case 315a is described. However, these attachment portions may be formed on at least one or more surfaces and may be formed on all the surfaces including the top surface.

Next, the assembly of lower case 315a and upper cover 315b is described with reference to FIGS. 11 and 13.

Lower case 315a is provided with latching protrusions 341a and 341b on the outer peripheral surfaces (desirably, opposing two surfaces) and prepared screw holes 343a and 343b at the corners. Upper cover 315b is provided with elastic pieces 342a and 342b capable of being engaged in latching protrusions 341a and 341b and screw holes 344a and 344b facing prepared screw holes 343a and 343b. When upper cover 315b is inserted into lower case 315a housing capacitor block 311 and control circuit portion 312, etc., latching protrusions 341a and 341b are engaged with elastic pieces 342a and 342b, and screws 345a and 345b (tapping screws) is allowed to pass through screw holes 344a and 344b so as to be fixed to prepared screw holes 343a and 343b.

With the above-mentioned configuration, tacking can be carried out before screw-fixing. Therefore, properties can be checked in this state and only good products after check may be fixed with screws. However, in the configuration employing only screw-fixing, if defects are found and upper cover 315b needs to be removed, fixed screws 345a and 345b need to be taken out again. At this time, since screws 345a and 345b to be used are type of screws to be directly screwed to resin (tapping screws), when screwing is carried out again, screw-fixing strength is deteriorated, and in some cases, lower case 315a has to be exchanged.

Meanwhile, configuration using only elastic pieces 342a and 342b and latching protrusions 341a and 341b can be deassembled when defects are found. However, in such a configuration, when, for example, falling occurs at the time of delivery or attachment to a vehicle as products or depending upon using conditions, upper cover 315b may be dropped off. According to this exemplary embodiment, process is reasonable, screwing portions can be minimized and quality as a unit can be maintained and improved.

Next, although not shown, lower case 315a, upper cover 315b and holder 317 are components made of resin and they need to retain a plurality of capacitors 316 stably. Furthermore, it is necessary to house capacitor block 311 and control circuit portion 312, etc. in a case stably. In addition, it is desirable that these components are formed of resin material of the reinforced grade containing glass fiber and in which warping is not likely to occur assuming that they are attached to a vehicle and used in a harsh environment.

As mentioned above, the present invention can provide a capacitor unit capable of retaining a plurality of capacitors with high reliability and exhibiting properties of capacitors to its maximum. In addition, it can provide a capacitor unit which is configured by considering safety control of charge and discharge of a capacitor, detection of deterioration, and assembly to a vehicle, etc., and has high reliability and excellent usability.

INDUSTRIAL APPLICABILITY

The capacitor unit of the present invention configured by a capacitor block including a plurality of capacitors and a circuit board on which the plurality of capacitors are mounted, which are fixed and integrated to each other by using a holder. The capacitor unit of the present invention solves the problem that a circuit board is distorted and deformed or broken by vibration, etc., or crack occurs in soldering portions of lead wires of capacitors. Furthermore, the present invention provides a capacitor unit having a high reliability in which short-circuit defects do not occur even when an explosion-proof valve operates. The capacitor unit of the present invention is suitable for application that requires resistance to vibration or thermal shock. Furthermore, since the capacitor unit of the present invention can exhibit properties of capacitors to its maximum, it is also suitable for application as a capacitor unit for auxiliary power in an electronic control braking system of vehicles, etc.

The invention claimed is:

1. A capacitor unit comprising:
   a plurality of capacitors;
   a circuit board on which a circuit pattern for connecting the plurality of capacitors in series or in parallel is formed; and
   a holder sandwiching and returning body parts of the plurality of capacitors,
   wherein the plurality of capacitors have bipolar electrodes consisting of lead wires extending in the same direction;
   wherein the holder has cylindrical housing portions for sandwiching and housing the body parts of the plurality of capacitors; and
   wherein the circuit board is fixed to a plurality of height regulation bosses provided on the holder.

2. The capacitor unit according to claim 1, wherein the cylindrical housing portion has an inner diameter that is slightly larger than an outer diameter of the capacitor and has, on an inner surface thereof, two or more ribs with which the capacitor is press-fitted and retained.

3. The capacitor unit according to claim 1, wherein the cylindrical housing portion has an inner diameter that is slightly larger than an outer diameter of the capacitor and has, on an inner surface thereof, two or more elastic pieces consisting of a slit and a holding pawl with which the capacitor is retained.

4. The capacitor unit according to claim 1, wherein at least two of the height regulation bosses have protrusions for positioning the circuit board, and the circuit board is provided with holes corresponding to the protrusions, each having a position-regulation function.

5. The capacitor unit according to claim 1, wherein at least two of the height regulation bosses have screw holes for fixing the circuit board, and the circuit board is fixed with screws, thereby fixing the holder and the circuit board at a predetermined height.

6. The capacitor unit according to claim 1, wherein the height regulation boss has a positioning protrusion and a screw hole concentrically, and a height of the positioning protrusion is lower than a thickness of the circuit board.

7. The capacitor unit according to claim 1, wherein the lead wires are bent at an intermediate portion toward a soldering portion so that a length from an exit of the capacitor to a fixed portion of the circuit board becomes substantially longer.

8. A capacitor unit comprising:
a plurality of capacitors;
a circuit board on which a circuit pattern for connecting the plurality of capacitors in series or in parallel is formed; and
a holder sandwiching and returning body parts of the plurality of capacitors,
wherein the holder is attached to an attaching position inside a case via a plurality of attaching portions provided on an outer periphery of the holder; and predetermined space is retained between a bottom portion of the capacitor and a bottom portion of the case.

9. The capacitor unit according to claim 8, wherein the capacitor has an opening structure for releasing electrolyte on the bottom portion thereof.

10. The capacitor unit according to claim 9, wherein space between the bottom portion of the capacitor and the bottom portion of the case is set to predetermined space capable of allowing the opening structure to operate.

11. The capacitor unit according to claim 9, wherein the case has barriers for preventing electrolyte from conducting between neighboring capacitors when the opening structure operates and electrolyte leaks out.

12. The capacitor unit according to claim 9, wherein the case has barriers for preventing electrolyte from conducting between series connections having a potential difference when the opening structure operates and electrolyte leaks out.

13. A capacitor unit comprising:
a plurality of capacitors;
a circuit board on which a circuit pattern for connecting the plurality of capacitors in series or in parallel is formed;
a holder sandwiching and returning body parts of the plurality of capacitors,
a capacitor block formed of the plurality of capacitors, the holder and the circuit board;
a control circuit portion on which a charge and discharge circuit for charging and discharging the capacitor block is formed; and
a connector for electrically connecting the capacitor block to the control circuit portion,
wherein the control circuit portion charges and discharges the capacitor by a charging/discharging signal of external load, and
wherein the holder has, on an upper surface of the holder, a plurality of height regulation bosses so that space between the upper surface of the capacitor and the circuit board is maintained at a predetermined distance.

14. The capacitor unit according to claim 13, wherein the control circuit portion comprises an input/output connector electrically linked to the external load, and the input/output connection is housed in a case together with the capacitor block.

15. The capacitor unit according to claim 13, wherein the capacitor has bipolar electrodes consisting of lead wires extending in the same direction.

16. The capacitor unit according to claim 13, wherein at least two of the height regulation bosses have protrusions for positioning the circuit board, and the circuit board is provided with holes corresponding to the protrusions, each having a position-regulation function.

17. The capacitor unit according to claim 13, wherein at least two of the height regulation bosses have screw holes for fixing the circuit board, and the circuit board is fixed with screws, thereby fixing the holder and the circuit board at a predetermined height.

18. The capacitor unit according to claim 13, wherein the height regulation boss has a positioning protrusion and a screw hole concentrically, and a height of the positioning protrusion is lower than a thickness of the circuit board.

19. The capacitor unit according to claim 15, wherein the lead wires are bent at an intermediate portion toward a soldering portion so that a length from an exit of the capacitor to a fixed portion of the circuit board becomes substantially longer.

20. The capacitor unit according to claim 13, wherein the capacitor has an opening structure for releasing electrolyte on the bottom portion thereof.

21. The capacitor unit according to claim 13, wherein the plurality of capacitors are disposed so that lead lands of neighboring capacitors on the circuit board are in the same potential.

22. The capacitor unit according to claim 13, wherein the circuit board has a resistor for balancing voltage corresponding to the number of series connections of the capacitors, which is mounted in parallel to the capacitor.

23. The capacitor unit according to claim 13, wherein the circuit board has a test point for monitoring at least voltage or property every parallel block of the capacitors.

24. The capacitor unit according to claim 13, wherein a control circuit portion has a function of monitoring at least voltage or property of the capacitor block.

25. The capacitor unit according to claim 13, wherein the holder comprises a cylindrical housing portion that sandwiches and houses body parts of the plurality of capacitors and fixes the capacitors so that the capacitors do not move due to external vibration factors.

26. The capacitor unit according to claim 25, wherein the cylindrical housing portion has an inner diameter that is slightly larger than an outer diameter of the capacitor and has, on an inner surface thereof, two or more ribs with which the capacitor is press-fitted and retained.

27. The capacitor unit according to claim 25, wherein the cylindrical housing portion has an inner diameter that is slightly larger than an outer diameter of the capacitor and has, on an inner surface thereof, two or more elastic pieces consisting of a slit and a holding pawl with which the capacitor is retained.

28. The capacitor unit according to claim 14, wherein the capacitor block is attached to an attaching position inside the case via a plurality of attaching portions provided on the outer periphery of the holder; and predetermined space is retained between a bottom portion of the capacitor incorporated into the holder and a bottom portion of the case.

29. The capacitor unit according to claim 28, wherein space between the bottom portion of the capacitor and the bottom portion of the case is set to predetermined space capable of allowing the opening structure to operate.

30. The capacitor unit according to claim 14, wherein the case has, on a bottom portion of the case, barriers for preventing electrolyte from conducting between neighboring capacitors when the opening structure operates and electrolyte leaks out.

31. The capacitor unit according to claim 14, wherein the case has, on a bottom portion of the case, barriers for preventing electrolyte from conducting between series connections having a potential difference when the opening structure operates and electrolyte leaks out.

32. The capacitor unit according to claim 14,
   wherein the case comprises a lower case and an upper cover;
   wherein the lower case has a regulation wall between the capacitor block and the control circuit portion;
   wherein the capacitor block and the control circuit portion are electrically connected to each other via a relay connector; and
   wherein the upper cover covers an entire portion.

33. The capacitor unit according to claim 14, wherein the case has, on a side surface, a screw-fixing nut for fixing a bracket that is to be attached and a body to be fixed to each other.

34. The capacitor unit according to claim 33, wherein the nut is press-fitted into a hole provided on a side surface of the case with a strength capable of enduring a torque necessary for screw-fixing.

35. The capacitor unit according to claim 32, wherein the nut is formed by insert formation into a hole provided on a side surface of the case with a strength capable of enduring a torque necessary for screw-fixing.

36. The capacitor unit according to claim 32, wherein the case has, in a vicinity of the nut, a position regulating guide for attaching the bracket.

37. The capacitor unit according to claim 36, wherein the position-regulation guide is formed of a concave hole.

38. The capacitor unit according to claim 36, wherein the position-regulation guide is formed of a convex boss.

39. The capacitor unit according to claim 32, wherein the lower case and the upper cover are fixed to a snap fit portion, which is configured by at least one or more pawl portions and rock portions formed by molding, by screw-fixing at least one or more portions.

* * * * *